United States Patent [19]

Talati et al.

[11] Patent Number: 5,067,072

[45] Date of Patent: * Nov. 19, 1991

[54] VIRTUAL SOFTWARE MACHINE WHICH PREPROCESSES APPLICATION PROGRAM TO ISOLATE EXECUTION DEPENDENCIES AND USES TARGET COMPUTER PROCESSES TO IMPLEMENT THE EXECUTION DEPENDENCIES

[75] Inventors: Kirit K. Talati, Sunnyvale; C. Willard Lackie, Garland, both of Tex.

[73] Assignee: VISystems, Inc., Dallas, Tex.

[ * ] Notice: The portion of the term of this patent subsequent to Oct. 2, 2007 has been disclaimed.

[21] Appl. No.: 591,463

[22] Filed: Oct. 1, 1990

Related U.S. Application Data

[63] Continuation of Ser. No. 391,691, Aug. 10, 1989, Pat. No. 4,961,133, which is a continuation of Ser. No. 118,307, Nov. 6, 1987, abandoned.

[51] Int. Cl.$^5$ .............................................. G06F 9/455
[52] U.S. Cl. .................................. 395/650; 364/228; 364/280.4; 364/239.9; 364/222.81; 364/DIG. 1
[58] Field of Search ... 364/200 MS File, 900 MS File

[56] References Cited

U.S. PATENT DOCUMENTS

| | | | |
|---|---|---|---|
| 4,567,574 | 1/1986 | Saade et al. | 364/900 |
| 4,636,948 | 1/1987 | Gsdaniec et al. | 364/200 |
| 4,672,532 | 6/1987 | IongeVos | 364/200 |
| 4,734,854 | 12/1988 | Afshar | 364/200 |
| 4,791,558 | 12/1988 | Chastin et al. | 364/200 |
| 4,943,912 | 7/1990 | Aoyama et al. | 364/200 |

OTHER PUBLICATIONS

Unicorn Press Release of 6/23/86.
Unicorn MicroCICS Product Description of 11/5/84.

*Primary Examiner*—Thomas C. Lee
*Assistant Examiner*—William M. Treat
*Attorney, Agent, or Firm*—David H. Judson

[57] ABSTRACT

The present invention relates to a virtual software machine for providing a virtual execution environment in a target computer for an application software program having one or more execution dependencies that are incompatible with a software execution environment on the target computer. The machine comprises a plurality of independent processes, and a virtual control mechanism having a virtual management interface (VMI) for generating requests for execution to the plurality of independent processes and receiving results of such processing. The requests for execution and the results are communicated via a message exchange mechanism. The machine also includes a pre-processor for generating a pre-processed application program in which the execution dependencies are masked. A compiler/linker receives the pre-processed application program and the virtual control mechanism and generates executable code for the operating system of the target computer. A run-time module of the machine is run by the operating system of the target computer for executing the application software program in the target computer despite the execution dependency that is incompatible with the target computer system software execution environment.

7 Claims, 3 Drawing Sheets

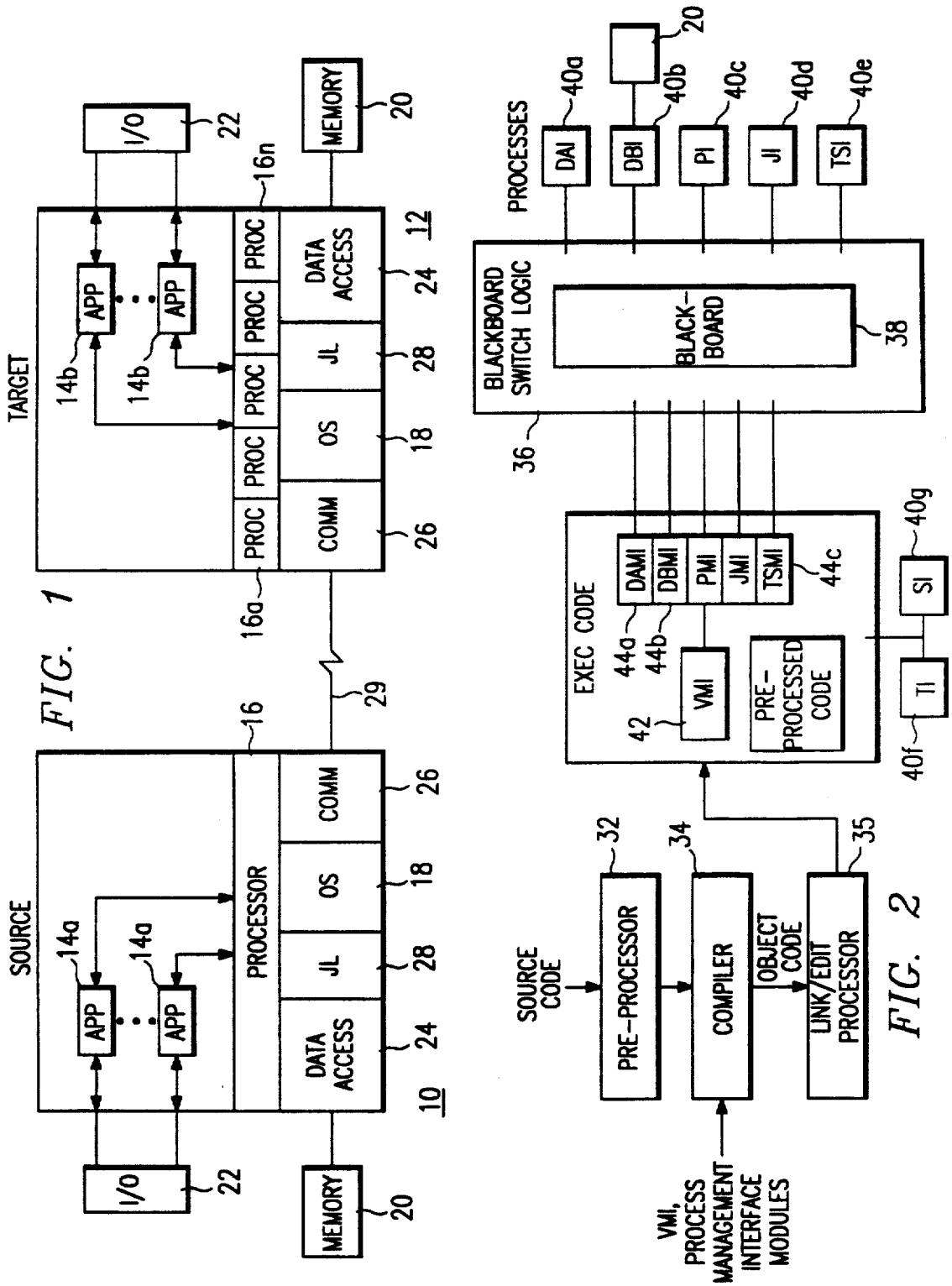

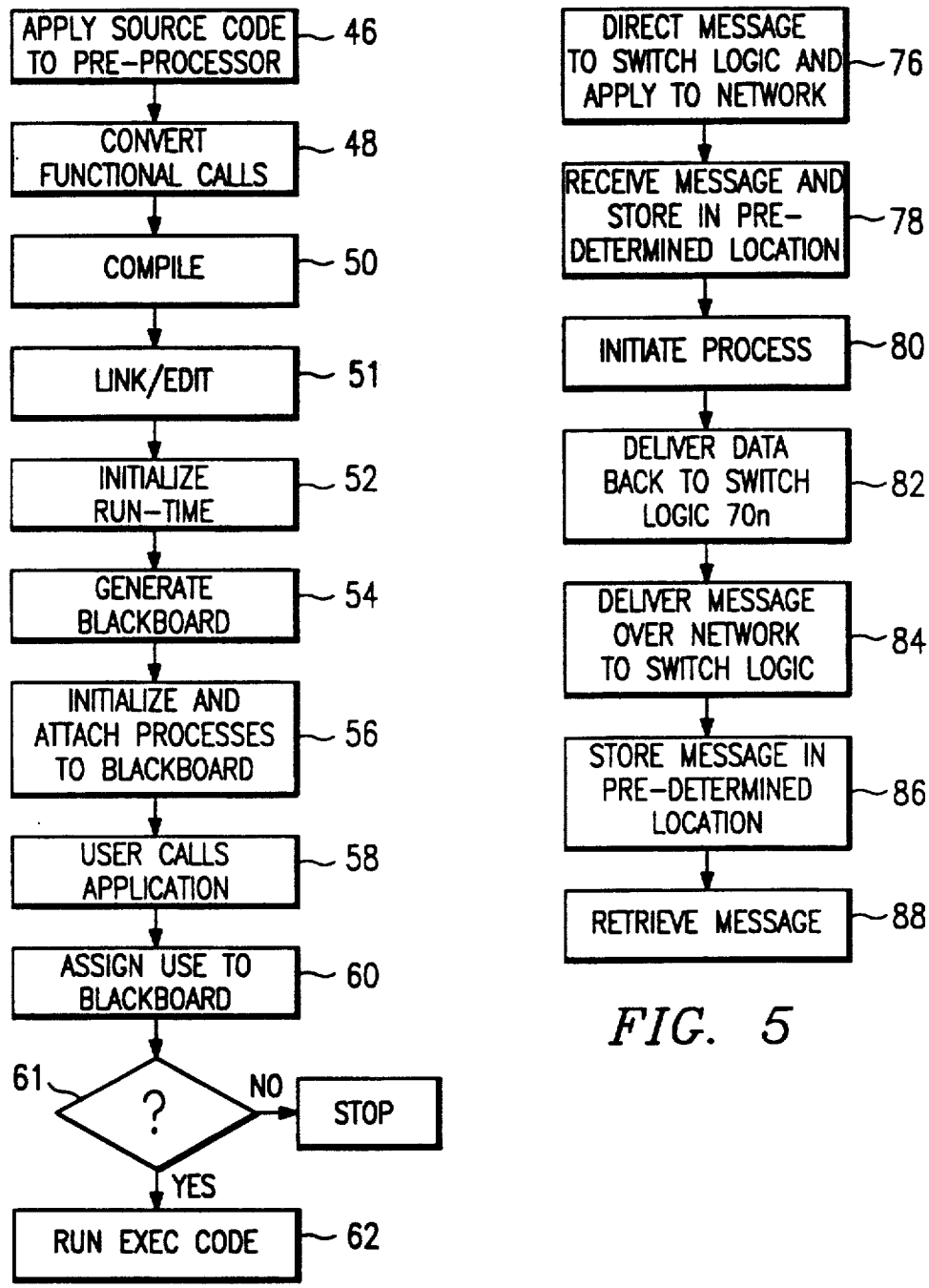

VIRTUAL SOFTWARE MACHINE WHICH PREPROCESSES APPLICATION PROGRAM TO ISOLATE EXECUTION DEPENDENCIES AND USES TARGET COMPUTER PROCESSES TO IMPLEMENT THE EXECUTION DEPENDENCIES

This application is a continuation of prior copending application Ser. No. 07/391,691, filed on Aug. 10, 1989, now U.S. Pat. No. 4,961,133, which was a continuation of prior application Ser. No. 07/118,307, filed Nov. 6, 1987, now abandoned.

TECHNICAL FIELD

The present invention relates generally to computer systems and more particularly to a virtual interface architecture for porting application software, normally compatible with a "source" computer, to a heterogenous or "target" computer.

BACKGROUND OF THE INVENTION

Computer systems having homogeneous hardware can interact and share data over a network. For example, a "local area network" can connect two or more computers located in physical proximity to enable users to access a shared database. Moreover, it has also been possible in the prior art to exchange software between identical types of machines. To the contrary, most interactions between heterogenous machines still involve little more that simple transfers of data files or the like. Software applications written for one type of hardware or for one specific type of operating environment, however, cannot be ported or "transferred" to a system having different physical characteristics without being entirely rewritten. Therefore, while much progress has been made in developing techniques for exchanging data between incompatible machines, it has not been possible to exchange software between heterogenous computer systems.

There have been a number of solutions proposed to overcome the "compatibility" problems associated with the enormous array of prior art computer systems having diverse and incompatible hardware and/or software. One solution is the use of a single operating system along a continuum of hardware products from microcomputer to mainframe. Although this approach is a satisfactory solution with respect to the products of an individual manufacturer, it does not allow the transfer of software applications across incompatible hardware and operating system environments. Another alternative would be the creation of a common communication environment across distributed systems through use of a standard industry-wide protocol. While some efforts have been made to generate standards for such a protocol, this solution presents complex technological problems.

There therefore exists a need for an interface system which provides application program portability and consistency across diverse computer environments.

BRIEF SUMMARY OF THE INVENTION

It is an object of the present invention to provide an architecture for porting application software, normally compatible with a "source" computer, to a heterogenous or "target" computer.

It is still another object to create a "virtual" interface architecture which enables heterogenous machines to mask the differences in their hardware and software by isolating the application software from the processing environment.

It is another object of the invention to provide application program portability and consistency across a number of different office automation, transaction processing and non-procedural language-based system architectures.

It is yet a further object of the present invention to enable an existing application program to function as a direct link to the hardware and operating system of a diverse computer system without a transaction processing system.

It is another object of the present invention to provide a method and apparatus which facilitates the functional interconnection of programs written in procedural programming languages (such as "C", "COBOL" or "ADA"), or the interconnection of a program written in a procedural programming language with a program written in a non-procedural programming language (such as "LISP" or "PROLOG").

It is a further object of the present invention to allow the development of application programs on micro or minicomputers for migration to mainframe computers and vice versa. As a byproduct, the present invention allows existing mainframe transaction processing system applications to run on micro or mini-computers without modifications or programming changes.

It is still another object to provide a virtual interface system which will enable the migration of existing applications to new and more advanced hardware environments created in the future.

According to the preferred embodiment of the invention, a virtual interface system for porting application software to a heterogenous or "target" computer comprises a plurality of independent interface processes for running in one or more distributed processors of the target computer. One or more of the processes are used to carry out at least one task required by the application software. The system also includes a pre-processor and compiler for processing program code of the application software into object code compatible with the target computer. According to the preferred embodiment, the program code of the application software is pre-processed by identifying functional calls therein, converting the functional calls in the program code to functional calls in the language native to the target computer, and compiling the functional calls of the language native to the target computer to create the object code. The pre-processor is implemented in either the source computer or the target computer.

The object code corresponding to the pre-processed program code is then linked with control codes of the virtual interface system to generate code fully executable by the operating system of the target computer. The system control codes include a plurality of so-called process management interface modules for communicating with the plurality of processes via a partitioned storage area, and a virtual management interface for controlling the plurality of process management interface modules. The virtual management interface and the process management interface modules are compiled into object code before linkage with the object code corresponding to the pre-processed program code.

According to a feature of the invention, the virtual interface system further includes a blackboard switch logic for generating the partitioned storage area and for interfacing the plurality of processes to the process management interface modules via the partitioned storage area. All communications to and from the processes go through the blackboard switch logic to the partitioned storage area and vice versa.

In a run-time mode, the executable code (comprising the linked pre-processed program code the virtual management interface and the process management interface modules) is run using the operating system of the target computer. This operation enables the process management interface modules to control the processes via the blackboard switch logic and the partitioned storage area and thereby enable the processes to carry out the task required by the application software.

In accordance with another feature of the invention, the target computer includes a plurality of partitioned storage areas, each generated and controlled by its own blackboard switch logic. Each of the partitioned storage areas may also include its own plurality of independent processes. In this architecture, processes associated with one partitioned storage area communicate with processes associated with another partitioned storage area via the blackboard switches. In addition to routing data and control information between the process management interface modules and the processes via the partitioned storage areas, each blackboard's switch logic includes security and encryption/decryption algorithms to prevent or limit access to the one or more storage areas.

BRIEF DESCRIPTION OF THE DRAWINGS

For a more complete understanding of the present invention and the advantages thereof, reference is now made to the following Description taken in conjunction with the accompanying Drawings in which:

FIG. 1 is a block diagram of a source computer and a heterogenous or "target" computer;

FIG. 2 is a simplified block diagram of a virtual interface system of the present invention for providing application program portability and consistency across the source and target computers of FIG. 1;

FIG. 3 is a simplified flowchart showing the basic operating steps of the virtual interface system of FIG. 2;

FIG. 5 is a flowchart representation describing how the virtual interface system of FIG. 4 effects retrieval of data from a remote database of the target computer.

DETAILED DESCRIPTION

Figure 4:
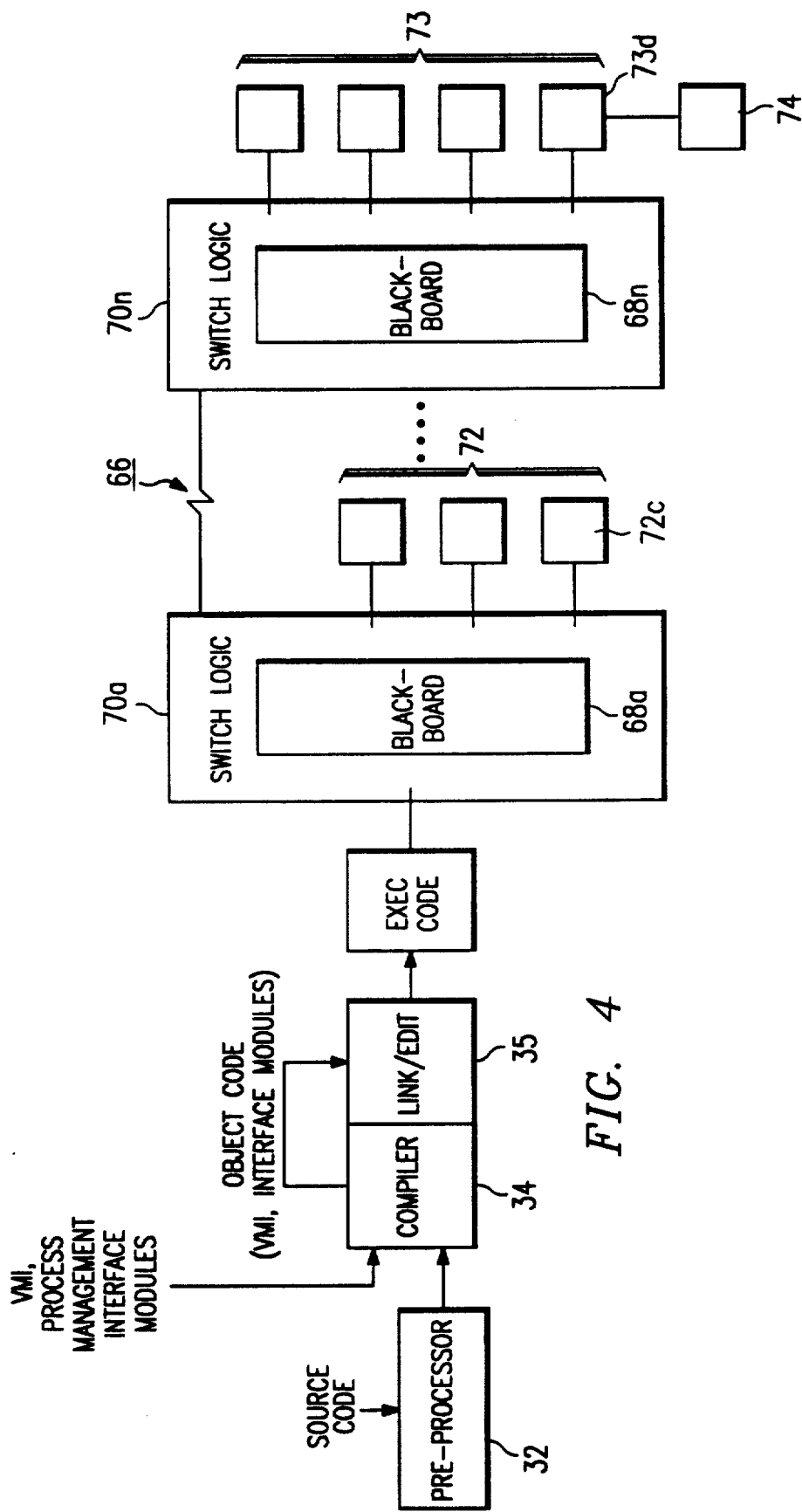
FIG. 4 is a simplified block diagram of a modified virtual interface of the invention wherein the target computer includes a distributed blackboard architecture having a plurality of partitioned storage areas.

With reference now to the drawings wherein like reference characters designate like or similar parts throughout the several figures, FIG. 1 is a simplified block diagram of a "source" computer 10 and a heterogenous or "target" computer 12. As used herein, "heterogenous" refers to the fact that application program(s) 14a written for the source computer 10 cannot be run on the target computer 12 because computers 10 and 12 are incompatible at the hardware and/or software level. For example, and not by way of limitation, application programs 14a of the source computer 10 may comprise a set of procedural based programs written in "C", "COBOL" or "ADA", whereas application programs 14b of the target computer 12 may comprise a set of knowledge-based programs written in "LISP". Or, source computer 10 may comprise a transaction processing system such as IBM's CICS (customer information control system) whereas the target computer 12 may include non-IBM hardware for running an expert system or the like. In both cases, application programs 14a or 14b are not capable of being transferred or "ported" to the incompatible computer 12 or 10, respectively.

Each of the computers 10 and 12 includes one or more integrated or distributed processors 16a–16n capable of receiving and manipulating data and generating outputs, operating system software 18 which controls the operation of the overall computer system, memory (e.g., a disc drive and a suitable disk storage) 20 for storing data and application programs, input/output devices (e.g., keyboards, printers, CRT's, etc.) 22 for enabling a user to interact with the system, database management system 24 for controlling access to and storage of data, communications system 26 for controlling communications to and from the computer system via network 29 for example, and journal system 28 for storing and retrieving data from a journal. Such elements are, of course, conventional in the prior art. As will be described below, the virtual interface architecture of the present invention provides the capability to port application programs 14a (normally compatible with the source computer 10) to the target computer 12 and vice-versa, without modifications or programming changes to such programs. As used herein, "virtual" is the opposite of "transparent" in the sense that something "transparent" appears to the user not to exist but in fact does, while something "virtual" appears to the user to exist but does not.

The objects of the invention are achieved by the novel virtual interface system 30 as shown in the simplified block diagram of FIG. 2. As discussed above, virtual interface system 30 enables the application programs 14a to be executed without regard to whether such programs are compatible with the processor(s) 16, operating system 18, storage devices 20, input/output devices 22, data access system 24, communications system 26 or journal system 28 of the target computer system 12. The present invention therefore provides complete application program independence from the hardware, operating system, language, database management system and network characteristics of a heterogenous computer system. In this way, the virtual interface system enables software applications to be environment-independent by masking differences in the physical and functional characteristics of the source and target computers.

Virtual interface system 30 comprises a number of functional elements: a pre-processor 32, a compiler 34 for generating object code compatible with (but not executable by) the operating system of the target computer 12, a link/edit processor 35 for linking various object code programs to create fully-resolved core image code ("EXEC CODE") executable by the operating system of the target computer, a blackboard switch logic 36, a partitioned storage area 38, and a plurality of independent processes 40a–40n for running in the one or more processors 16 of the target computer system 12. Each of the processes 40 comprises an independently schedulable unit of computation which, in conjunction with one or more other processes, carries out one or more "tasks" required by the application program. Each task therefore consists of one or more independent processes.

According to the invention, the blackboard switch logic 36 is controlled by the operating system 18 of the target computer 12 to generate the partitioned storage area 38, or "blackboard". As will be described, the blackboard switch logic 36 is the conduit for all communications to and from the processes 40a-40n and all such communications follow the same route: through the blackboard switch logic 36 to the partitioned storage area 38, or from the partitioned storage area through the blackboard switch logic. The routing of data and information through the blackboard switch logic 36 and the partitioned storage area 38 is controlled by the executable code ("EXEC CODE") output from the link/edit processor 35. As will be described, the executable code comprises linked object code programs representing (a) pre-processed program code of the application program, (b) a so-called virtual management interface ("VMI") 42, and (c) a plurality of process management interface modules 44a-44n. The object code representing the VMI 42 and the plurality of process management interface modules 44 is generated by the compiler 34.

According to the invention, the process management interface modules 44 control the processes 40 via the blackboard switch logic 36 and the partitioned storage area 38. Processes 40 and the executable code are capable of being executed in the target computer 12 but not in the source computer 10. As will be described, the blackboard switch logic 36 also includes security and encryption/decryption routines for preventing or limiting data access or retrieval from the partitioned storage area, a data compression routine for conserving available memory in the blackboard, and a routine for controlling inter-blackboard communications.

The operation of the virtual interface system 30 of FIG. 2 can now be described in connection with the flowchart of FIG. 3. In general, the virtual interface system enables application programs to run irrespective of the hardware environment. This is accomplished by masking the application program and operating system functional calls (written, for example, in "ADA," "C," "CICS," "COBOL," "LISP," "PROLOG," etc.) from the hardware by linking the code of the original application program to/from the hardware operating system. This masking is carried out by the pre-processor 32 and provides both the user/programmer and the hardware with what each expects to see even though they are communicating in two different languages.

In particular, the source code of an application 14a is applied to the pre-processor 32 of the virtual interface system 30 at step 46. Pre-processor 32 identifies the functional calls (i.e., tasks) in the program code and, at step 48, converts these functional calls to functional calls of the language native to the target computer (i.e., to the compiler 34). For example, if the application program 14a is a CICS application and the target computer is "C"-based, pre-processor 32 serves to format the CICS functional calls in the source code to "C" calls. The output of the pre-processor 32 is then supplied to the compiler 34 which, at step 50, compiles the "C" code into object code compatible with but not fully executable by the operating system 18 of the target computer 12. Although not shown in detail in FIG. 3, the pre-processor 32 also masks the hardware operating system functional calls to the original application program. Steps 46-50 represent a "development" mode of operation and may be carried out at any time in either the source or target computer.

At step 51, the object code corresponding to the pre-processed program code 32 is linked to the (previously generated) object codes of the VMI 42 and the process management interface modules 44. This linkage is carried out by the link/edit processor 35 in a conventional fashion known in the art. The resulting "EXEC CODE" comprises a plurality of calls to the virtual management interface 42 (and thus the process management interface modules) for carrying out the tasks required by the application program. At step 52, the "run-time" mode of operation is initialized. This causes the blackboard switch logic 36, at step 54, to generate the partitioned storage area 38 in memory of the target computer 12. The blackboard switch logic 36 also functions, at step 56, to initialize the processes 40 and "attach" the processes to the partitioned storage area 38. As used herein, the "attaching" of processes refers to the assignment of a designated discrete portion of the partitioned storage area 38 for each process 40. Communications to and from each such process must therefore be addressed to the discrete portion of the partitioned storage area 38 designated by the blackboard switch logic 36 at step 56. In this manner, the blackboard switch logic 36 uses so-called "reserved spot" communication for data access to and from the partitioned storage area 3B.

At step 58, a user of the target computer system 12 calls the software application for execution. This application, normally incompatible with the target computer 12, has been pre-processed, compiled and linked with the VMI and interface modules to generate executable code as previously described At step 60, the blackboard switch logic 36 assigns the user to the partitioned storage area 38. A test 61 is then run to determine if use is authorized. This test uses the security routines of the blackboard switch logic 36. If use is authorized, processing begins. In particular, the executable code (and thus the virtual management interface 42) is run by the operating system 18 of the target computer 12 at step 62 to call one or more of the process management interface modules 44a-44n as required by the application software task(s). Each of the process management interface modules then communicates with the one or more processes 40a-40n via the blackboard switch logic 36 and blackboard 38 to perform the task.

It can be seen therefore that the interface system 30 uses a "virtual" architecture to perform program "tasks" using a plurality of machine-independent "interface" processes 40 which are interfaced to a plurality of process management interface modules via a switch logic-generated partitioned storage area. The process management interface modules 44 do not perform the tasks themselves, rather, they serve only to interface to those processes which actually do perform the tasks. This separation of the processes 40 from the process management interface modules 44 via the blackboard switch logic and blackboard advantageously enables the system 30 to provide application program portability and consistency across diverse computer environments to achieve the objects of the present invention.

Only the executable code and the interface processes 40 need be tailored to the target computer 12 environment. Moreover, the processes themselves can be located in one or more distributed processors 16a-16n of the target computer 12, thus facilitating the use of parallel processing techniques and fault tolerant processing.

Referring now to FIG. 4, an alternate embodiment of the virtual interface system is shown. In this embodiment, the target computer 12 includes two or more partitioned storage areas 68a-68n each generated and controlled by a corresponding blackboard switch logic 70a-70n in the manner previously described. In this architecture, each of the blackboards 68 has its own set 72 and 73 of processes and the identity of the processes in each set may differ from one blackboard to the next. Certain specified processes may thus be carried out in remote locations of the target computer via inter-switch logic communications over a network 66. According to another feature of the invention, data and control information is passed between the partitioned storage areas via the blackboard switch logic. Such communications are controlled by a blackboard-to-blackboard communications routine resident in the blackboard switch logic 36 associated with each blackboard. This operation is shown by way of example in FIG. 5.

In particular, assume that a process 73d is associated with the blackboard switch logic 70n of FIG. 4 and controls data access from a database 74. If a process 772c, for example, requires data from the database 74, the following steps are carried out. At step 76, process 72c directs a message to the blackboard switch logic 70a which then, through its blackboard-to-blackboard communications routine, places the message on the network 66. At step 78, the blackboard switch logic 70n receives the message and places it in a specific location of the blackboard 68n associated with the process 73d. Once notified of the message, process 73d is then carried out at step 80 to retrieve the data from the database 74. The required data is then appended to a message at step 82 and delivered, by the process 73d, back to the blackboard switch logic 70n. At step 84, the blackboard switch logic 70n uses its blackboard-to-blackboard communication routine to deliver the message over the network 66 back to the blackboard switch logic 70a. At step 86, the blackboard switch logic 70a places the message in the blackboard 68a at the location associated with the originating process 72c. At step 88, the message is retrieved by the process 72c from the blackboard 68a.

Referring now back to FIG. 2, the plurality of interface processes 40 preferably include at least the following:

Data Access Interface Process ("DAI") 40a for managing data access to and from a database management system 24 via one or more database interface processes (DBI);

Database Interface Process ("DBI) 40b—for storing and retrieving data from the database management system 24;

Presentation Interface Process ("PI") 40c for controlling data presentation on the input/output devices 22 of the target computer system;

Journal Interface Process ("JI") 40d for storing and retrieving data from the journal system 28 of the target computer system;

Task Storage Interface Process ("TSI") 40e for controlling management and storage of data across tasks;

Storage Interface Process ("SI") 40f for controlling data management within a task and data management between tasks; and Task Control Interface Process ("TCI") 40g for controlling the initiation, delay, suspension or termination of a task.

The above processes, while exemplary, are not meant to be limiting. Data access interface process ("DAI") knows the symbolic (i.e., system) location of all data and uses one or more database interface processes to physically access such data. Moreover, with the exception of the storage and task control interface processes, each of the processes 40 cooperates with a corresponding process management interface module 44 in the manner previously described. For example, data access interface process ("DAI") 40a is controlled by a data access process management interface ("DAMI") module 44a which in turn is controlled by the virtual management interface ("VMI") 42. Likewise, presentation interface process ("PI") 40c cooperates with the PMI module 40c, and so forth.

Preferably, the storage interface process 40f and the task control interface process 40g are controlled by and communicate with the virtual management interface 42 via direct message exchanges rather than a blackboard. This scheme enables the virtual management interface 42 to exhibit direct or "action-centered" control of the SI and TCI processes.

In the preferred embodiment, data and/or control information is transferred (between tasks, between process management interface modules and processes, and between distributed blackboards) using the following "send" and "receive" message formats:
SEND (data, length, command, bbid, iid)
RECEIVE (data, length, command, bbid, iid); where
    data = information
    length = length of data
    command = action required or "subclass"
    bbid = identification of blackboard
    iid = process identification or "class" (blackboard address)

The following are representative program listings showing (a) a pre-processor for receiving a CICS application program and in response thereto generating a pre-processed program, (b) an exemplary CICS test program, (c) the CICS test program following processing by the pre-processor, (d) the journal management interface module ("JMI") prior to compiling, (f) the journal interface process ("JI") prior to compiling and (g) the blackboard switch logic. The blackboard switch logic includes four functional components: a blackboard generation and process attachment routine, a routine for attaching a user and an associated task to the blackboard (including security), the reserved-spot communication routines (for processing the "SEND" and "RECEIVE" messages) and a blackboard-to-blackboard communications routine.

```
/* VIRTUAL PREPROCESSOR */
%(
#include        "PARS.h"
#include        "DMI.h"
#include        "PMI.h"
int    state = 0;
int    site;
char   lang[20];
unsigned int    tflag;
char   string[40];
int    jstate = 0;
       struct
       (
```

```
            char ptr[30];
            int tf;
            int lc;
        } ptr[10];
int pf;
int ln = 1;
int i;
struct
{
unsigned int cad:3;
unsigned int func:5;
unsigned int mask:24;
}flag;
unsigned int *x = (unsigned int *)&flag;
%}
%p 4000
%a 10000
%o 8000
%e 1000
%n 1000
%%
[\n]        { ln++; if(state ==0) fprintf(yyout,"\n"); }
"EXEC CICS"/[" "\n]    { if (state != 0)
                        {
                        printf("ERROR in EXEC CICS command at line %d\n",ln);
                        state = 0;
                        }
                        else
                            {
                            state = 1;
                            for(i = 0; i < 8; i ++)
                            {
                            ptr[i].ptr[0] = '\0';
                            ptr[i].lc = 0;
                            ptr[i].tf = 0;
                            }
                            flag.mask = 0;
                            flag.cad  = 0;
                            flag.func = 0;
                            tflag = 0;
                            jstate = 0;
                            pf = 0;
                            }
                        }
RETURN/[" "\n]   |
LINK/[" "\n]     |
XCTL/[" "\n]     |
ABEND/[" "\n]    |
SUSPEND/[" "\n]  |
DELAY/[" "\n]    |
ASKTIME/[" "\n]  |
"ISSUE DISCONNECT"/[" "\n]   { if ( state == 0)
                                fprintf(yyout,"%s",yytext);
                            else
                                {
                                if(state != 1)
                                {
                                printf("ERROR in EXEC CICS command at line %d\n",ln);
                                state = 0;
                                }
                                else
                                {
                                        flag.cad = 1;
                                        state = 2;
                                if(strcmp(yytext,"RETURN") == 0)
                                        flag.func = 1;
                                if(strcmp(yytext,"XCTL") == 0)
                                        flag.func = 3;
                                if(strcmp(yytext,"LINK") == 0)
                                        flag.func = 2;
                                if(strcmp(yytext,"ABEND") == 0)
                                        flag.func = 4;
                                if(strcmp(yytext,"DELAY") == 0)
                                        flag.func = 5;
```

```
                if(strcmp(yytext,"ASKTIME") == 0)
                        flag.func = 6;
                if(strcmp(yytext,"ISSUE DISCONNECT") == 0)
                        flag.func = 7;
            )
        )
    )
ADDRESS/[" "\n]    |
INIT/[" "\n]       |
ASSIGN/[" "\n]     |
GETMAIN/[" "\n]    |
JOURNAL/[" "\n]    |
"HANDLE CONDITION"/[" "\n]    |
"HANDLE AID"/[" "\n]          |
"IGNORE CONDITION"/[" "\n]    |
"WAIT JOURNAL"/[" "\n] |
FREEMAIN/[" "\n] { if ( state == 0)
                fprintf(yyout,"%s",yytext);
            else
            {
            if(state != 1)
            {
            printf("ERROR in EXEC CICS command at line %d\n",ln);
            state = 0;
            }
            else
            {
                    flag.cmd = 0;
                    flag.func = 0;
                    state = 2;
                if(strcmp(yytext,"INIT") == 0)
                {
                        jstate = 1;
                }
                else
                if(strcmp(yytext,"ADDRESS") == 0)
                        jstate = 1;
                else
                if(strcmp(yytext,"ASSIGN") == 0)
                        jstate = 1;
                else
                if(strcmp(yytext,"GETMAIN") == 0)
                        flag.func = 12;
                else
                if(strcmp(yytext,"FREEMAIN") == 0)
                        flag.func = 13;
                else
                if(strcmp(yytext,"WAIT JOURNAL") == 0)
                {
                        flag.cmd = 4;
                        flag.func = 2;
                }
                else
                if(strcmp(yytext,"HANDLE CONDITION") == 0)
                {
                        flag.cmd = 6;
                        flag.func = 1;
                         jstate = 2;
                }
                else
                if(strcmp(yytext,"HANDLE AID") == 0)
                {
                        flag.cmd = 6;
                        flag.func = 2;
                         jstate = 2;
                }
                else
                if(strcmp(yytext,"IGNORE CONDITION") == 0)
                {
                        flag.cmd = 6;
                        flag.func = 3;
                         jstate = 2;
                }
                else
```

```
                    if(strcmp(yytext,"JOURNAL") == 0)
                    {
                            flag.cmd = 4;
                            flag.func = 1;
                    }
                }
            }
        }
SEND/[" "\n]            |
"ISSUE PRINT"/[" "\n]   |
"ISSUE COPY"/[" "\n]    |
"ISSUE ERASEAUP"/[" "\n]    |
"ISSUE RESET"/[" "\n]   |
RECEIVE/[" "\n]         { if ( state == 0)
                            fprintf(yyout,"%s",yytext);
                        else
                        {
                          if(state != 1)
                          {
                          printf("ERROR in EXEC CICS command at line %d\n",ln);
                          state = 0;
                          }
                          else
                          {
                                flag.mask |= DATA;
                                flag.mask |= MAP;
                                flag.cmd = 2;
                            if(strcmp(yytext,"SEND") == 0)
                                flag.func = 1;
                            if(strcmp(yytext,"ISSUE PRINT") == 0)
                                flag.func = 7;
                            if(strcmp(yytext,"ISSUE COPY") == 0)
                                flag.func = 8;
                            if(strcmp(yytext,"ISSUE ERASEAUP") == 0)
                                flag.func = 5;
                            if(strcmp(yytext,"RESET") == 0)
                                flag.func = 6;
                            if(strcmp(yytext,"RECEIVE") == 0)
                                flag.func = 11;
                                state = 2;
                          }
                        }
                    }
WRITE/[" "\n]           |
REWRITE/[" "\n]         |
READNEXT/[" "\n]        |
DELETE/[" "\n]          |
UNLOCK/[" "\n]          |
LOCK/[" "\n]            |
ENQ/[" "\n]             |
DEQ/[" "\n]             |
STARTBR/[" "\n]         |
READPREV/[" "\n]        |
RESETBR/[" "\n]         |
ENDBR/[" "\n]           |
"READQ TS"/[" "\n]      |
"WRITEQ TS"/[" "\n]     |
"DELETEQ TS"/[" "\n]    |
READQ/[" "\n]           |
WRITEQ/[" "\n]          |
DELETEQ/[" "\n]         |
"READQ TD"/[" "\n]      |
"WRITEQ TD"/[" "\n]     |
"DELETEQ TD"/[" "\n]    |
READ/[" "\n]            { if ( state == 0)
                            fprintf(yyout,"%s",yytext);
                        else
                        {
                          if(state != 1)
                          {
                          if(strcmp(yytext,"REWRITE") == 0)
                          {
                          if(flag.func == 14 && flag.cmd == 3)
                          flag.mask |= RWRITE;
                          }
                          else
                          {
```

```
                printf("ERROR in EXEC CICS command at line %d\n",ln);
                state = 0;
                }
              }
              else
               {
                flag.cmd = 3;
                state = 2;
                if(strcmp(yytext,"DEQ") == 0)
                       flag.func = 31;
                if(strcmp(yytext,"ENQ") == 0)
                       flag.func = 30;
                if(strcmp(yytext,"READ") == 0)
                       flag.func = 3;
                if(strcmp(yytext,"READNEXT") == 0)
                       flag.func = 4;
                if(strcmp(yytext,"READPREV") == 0)
                       flag.func = 5;
                if(strcmp(yytext,"RESETBR") == 0)
                       flag.func = 6;
                if(strcmp(yytext,"ENDBR") == 0)
                       flag.func = 7;
                if(strcmp(yytext,"STARTBR") == 0)
                       flag.func = 8;
                if(strcmp(yytext,"DELETE") == 0)
                       flag.func = 9;
                if(strcmp(yytext,"UNLOCK") == 0)
                       flag.func = 2;
                if(strcmp(yytext,"LOCK") == 0)
                       flag.func = 1;
                if(strcmp(yytext,"READQ TS") == 0
                     || strcmp(yytext,"READQ") == 0)
                       flag.func = 10;
                if(strcmp(yytext,"DELETEQ TS") == 0
                     || strcmp(yytext,"DELETEQ") == 0)
                       flag.func = 11;
                if(strcmp(yytext,"READQ TD") == 0)
                       flag.func = 12;
                if(strcmp(yytext,"DELETEQ TD") == 0)
                       flag.func = 13;
                if(strcmp(yytext,"WRITEQ TS") == 0
                     || strcmp(yytext,"WRITEQ") == 0)
                       flag.func = 14;
                if(strcmp(yytext,"WRITEQ TD") == 0)
                       flag.func = 15;
                if(strcmp(yytext,"WRITE") == 0)
                       flag.func = 16;
                if(strcmp(yytext,"REWRITE") == 0)
                       flag.func = 17;
                }
              }
            }
[A-Z]* { if ( state == 0)
              fprintf(yyout,"%s",yytext);
          else
           {
             if(state == 4) goto state4;
             else
             if(state != 2)
              {
              printf("ERROR in EXEC CICS command at line %d\n",ln);
              state = 0;
              }
             else
              {
               if(flag.cmd == 6)
                {
                  if((i =vcond(yytext)) == -1 )
                   {
              printf("ERROR IN EXEC CICS COMMAND at line - %d\n",ln);
              printf("invalid CONDITION - %s\n",yytext);
                  state = 0;
                    goto end2;
                  }
                 fprintf(yyout,"_HS\[%d].hc = %d;\n",i,flag.func);
                 switch(flag.func)
                  {
```

```
            case 1: case 2:
            fprintf(yyout,"STATUS = %d;\n",1);
            fprintf(yyout,"_HCOND = 1;\n");
            fprintf(yyout,"if(setjmp(jbuf) == 0)\n");
            state = 3;
              break;
            case 3:
            state = 2;
            break;
            default: ;
            }
         }
        else
         if(strcmp(yytext,"CAARG") == 0)
              {
              state = 3;
              pf = 1;
              ptr[pf].tf = 2;
              }
        else
         if(strcmp(yytext,"CAMIB") == 0)
              {
               flag.func = 20;
              state = 3;
              pf = 1;
              ptr[pf].tf = 3;
              }
        else
         if(strcmp(yytext,"CACOMMAREA") == 0)
              {
               flag.func = 21;
              state = 3;
              pf = 1;
              ptr[pf].tf = 3;
              }
        else
         if(strcmp(yytext,"CSA") == 0)
              {
              state = 3;
              flag.func = 1;
              pf = 1;
              ptr[pf].tf = 2;
              }
        else
         if(strcmp(yytext,"CWA") == 0)
              {
              state = 3;
              flag.func = 2;
              pf = 1;
              ptr[pf].tf = 2;
              }
        else
        if(strcmp(yytext,"TCTUA") == 0)
              {
              flag.func = 3;
              pf = 1;
              ptr[pf].tf = 2;
              state = 3;
              }
        else
        if(strcmp(yytext,"TWA") == 0)
              {
              flag.func = 4;
              pf = 1;
              ptr[pf].tf = 2;
              state = 3;
              }
        else
        if(strcmp(yytext,"CWALENG") == 0)
              {
              pf = 2;
              ptr[pf].tf = 5;
              flag.func = 5;
              state = 3;
              }
        else
          if(strcmp(yytext,"TCTUALENG") == 0)
```

```
        {
        flag.func = 7;
        pf = 2;
        ptr[pf].tf = 5;
        state = 3;
        }
else
if(strcmp(yytext,"TWALENG") == 0)
        {
        flag.func = 6;
        pf = 2;
        ptr[pf].tf = 5;
        state = 3;
        }
else
    if(strcmp(yytext,"ABSTIME") == 0)
        {
        state = 3;
        pf = 2;
        ptr[pf].tf = 2;
        }
else
    if(strcmp(yytext,"NUMITEM") == 0)
        {
        state = 3;
        pf = 3;
        ptr[pf].tf = 2;
        }
else
    if(strcmp(yytext,"RESOURCE") == 0)
        {
        state = 3;
        pf = 3;
        ptr[pf].tf = 1;
        }
else
    if(strcmp(yytext,"RIDFLD") == 0)
        {
        state = 3;
        pf = 3;
        ptr[pf].tf = 2;
        }
else
    if(strcmp(yytext,"LENGTH") == 0)
     {
        state = 3;
        pf = 2;
        ptr[pf].tf = 4;
     }
else
    if(strcmp(yytext,"PROGRAM") == 0)
        {
                pf = 3;
                ptr[pf].tf = 1;
                state = 3;
        }
else
    if(strcmp(yytext,"TRANSID") == 0)
        {
                pf = 3;
                ptr[pf].tf = 1;
                state = 3;
        }
else
    if(strcmp(yytext,"MAP") == 0)
        {
                pf = 3;
                ptr[pf].tf = 1;
                state = 3;
                  flag.func += 1;
        }
else
    if(strcmp(yytext,"MAPSET") == 0)
        {
                pf = 5;
                ptr[pf].tf = 1;
```

```
                    state = 3;
                )
        else
            if(strcmp(yytext,"DATASET") == 0)
                {
                        pf = 5;
                        ptr[pf].tf = 1;
                        state = 3;
                )
        else
            if(strcmp(yytext,"QUEUE") == 0)
                {
                        pf = 5;
                        ptr[pf].tf = 1;
                        state = 3;
                )
        else
            if(strcmp(yytext,"SYSID") == 0)
                {
                        pf = 7;
                        ptr[pf].tf = 1;
                        state = 3;
                )
        else
            if(strcmp(yytext,"SET") == 0)
                {
                flag.mask |= SET;
                state = 3;
                tflag |= SET;
                pf = 1;
                ptr[pf].tf = 3;
                )
        else
            if(strcmp(yytext,"DATA") == 0)
                {
                state = 3;
                pf = 1;
                tflag |= DATA;
                ptr[pf].tf = 3;
                )
        else
            if(strcmp(yytext,"FROM") == 0)
                {
                state = 3;
                tflag |= FROM;
                pf = 1;
                ptr[pf].tf = 2;
                )
        else
            if(strcmp(yytext,"INTO") == 0)
                {
                state = 3;
                tflag |= INTO;
                pf = 1;
                ptr[pf].tf = 2;
                )
        else
            if(strcmp(yytext,"COMMAREA") == 0)
                {
                state = 3;
                pf = 1;
                ptr[pf].tf = 2;
                )
        else
            if(strcmp(yytext,"REQID") == 0)
                {
                state = 3;
                pf = 3;
                ptr[pf].tf = 2;
                )
        else
          if(strcmp(yytext,"ITEM") == 0)
                {
                state = 3;
                pf = 4;
                ptr[pf].tf = 4;
                )
```

```
else
   if(strcmp(yytext,"KEYLENGTH") == 0)
      {
      state = 3;
      pf = 4;
      ptr[pf].tf = 4;
      }
else
   if(strcmp(yytext,"JFILEID") == 0)
      {
      state = 3;
      pf = 4;
      ptr[pf].tf = 4;
      }
else
   if(strcmp(yytext,"JTYPEID") == 0)
      {
      state = 3;
      pf = 5;
      ptr[pf].tf = 1;
      }
else
   if(strcmp(yytext,"PFXLENG") == 0)
      {
      state = 3;
      pf = 7;
      ptr[pf].tf = 4;
      }
else
   if(strcmp(yytext,"PREFIX") == 0)
      {
      pf = 6;
      ptr[pf].tf = 1;
      state = 3;
      }
else
   if(strcmp(yytext,"GENERIC") == 0)
      flag.mask |= GENERIC;
else
   if(strcmp(yytext,"NEXT") == 0)
      flag.mask |= NEXT;
else
   if(strcmp(yytext,"NOSUSPEND") == 0)
      flag.mask |= NOSUSPEND;
else
   if(strcmp(yytext,"GTEQ") == 0 )
      flag.mask |= GTEQ;
else
   if(strcmp(yytext,"STARTIO") == 0 )
      flag.mask |= STARTIO;
else
   if(strcmp(yytext,"EQUAL") == 0 )
      flag.mask |= EQUAL;
else
   if(strcmp(yytext,"RBA") == 0 )
      flag.mask |= RBA;
else
   if(strcmp(yytext,"RRN") == 0 )
      flag.mask |= RRN;
else
   if(strcmp(yytext,"UPDATE") == 0)
      flag.mask |= UPDATE;
else
   if(strcmp(yytext,"MASSINSERT") == 0)
      flag.mask |= MASSINSERT;
else
   if(strcmp(yytext,"ERASEAUP") == 0)
      flag.mask |= ERASEAUP;
else
   if(strcmp(yytext,"ERASE") == 0)
      flag.mask |= ERASE;
else
   if(strcmp(yytext,"MAPONLY") == 0)
      flag.mask = flag.mask ^ DATA;
```

```
                else
                   if(strcmp(yytext,"DATAONLY") == 0)
                        flag.mask = flag.mask ^ MAP;
                else
                   if(strcmp(yytext,"CURSOR") == 0)
                        flag.mask |= CURSOR;
                else
                   if(strcmp(yytext,"FREEKB") == 0)
                        flag.mask |= FREEKB;
                else
                   if(strcmp(yytext,"FRSET") == 0)
                        flag.mask |= FRSET;
                else
                   if(strcmp(yytext,"MAIN") == 0)
                        flag.mask |= MAIN;
                else
                   if(strcmp(yytext,"ALARM") == 0)
                        flag.mask |= ALARM;
                else
                   if(strcmp(yytext,"ALL") == 0)
                        flag.mask |= ALL;
                else
                   if(strcmp(yytext,"ASIS") == 0)
                        flag.mask |= ASIS;
                else
                   if(strcmp(yytext,"AUXILIARY") == 0)
                        flag.mask |= AUXILIARY;
                else
                   if(strcmp(yytext,"LAST") == 0)
                        flag.mask |= LAST;
                else
                   if(strcmp(yytext,"PAGING") == 0)
                        flag.mask |= PAGING;
                else
                   if(strcmp(yytext,"WAIT") == 0)
                        flag.mask |= WAIT;
                else
                   if(strcmp(yytext,"PRINT") == 0)
                        flag.mask |= PRINT;
                else
                {
                printf("ERROR in EXEC CICS command at line %d\n",ln);
                state = 0;
end2: ;
                }
            }
          }
        }
"("     { if ( state == 0)
                fprintf(yyout,"%s",yytext);
          else
                {
                 if(state != 3)
                   {
                   printf("ERROR in EXEC CICS command at line %d\n",ln);
                   state = 0;
                   }
                 else
                   {
                      state = 4;
                   }
                }
        }
"END-EXEC"/[" "\n]  { if ( state == 0)
                fprintf(yyout,"%s",yytext);
          else
                {
                 if(state > 2)
                   {
                   printf("ERROR in EXEC CICS command at line %d\n",ln);
                   state = 0;
                   }
                 else
                   {
                      state = 0;
                   if(;state == 0)
                      {
```

```
state6:
        for( i = 2; i < 8; i++)
        {
        switch(i)
        {
        case 2:
        if(ptr[i].lc)
        flag.mask |= LC2;
         else
        break;
        case 3:
        if(ptr[i].lc)
        flag.mask |= LC3;
        break;
        case 4:
        if(ptr[i].lc)
        flag.mask |= LC4;

break;
        case 5:
        if(ptr[i].lc)
        flag.mask |= LC5;
        break;
        case 6:
        if(ptr[i].lc)
        flag.mask |= LC6;
        break;
        case 7:
        if(ptr[i].lc)
        flag.mask |= LC7;
        break;
        }
        }
         if(strcmp(lang,"c") == 0)
          {
           if(ptr[1].ptr[0] != '\0' && ptr[1].tf != 3 && flag.func != 0)
           fprintf(yyout,"_SPTR = (char *)%s;\n",ptr[1].ptr);
          }
         else
         {
          if(ptr[1].ptr[0] != '\0')
          {
           if(ptr[2].ptr[0] == '\0' && ptr[1].tf != 3 && flag.cad == 3)
            {flag.mask |= LC2; flag.mask |= SLC2; ptr[2].lc = 6;
            }
           if(ptr[1].tf != 3 && flag.func != 0 )
            {
                strcpy(string,ptr[1].ptr);
                size = c2cob(string,ptr[1].tf);
                if(strcmp(ptr[1].ptr,"DFHCOMMAREA") == 0)
                ptr[1].tf = 3;
                else
                fprintf(yyout,"_SPTR = %s;\n",string);
            }

}
          if(ptr[3].ptr[0] != '\0')
          {
           if(ptr[4].ptr[0] == '\0' && flag.cad == 3)
            { flag.mask |= LC4; flag.mask |= SLC4; ptr[4].lc = 6; }
          }
         }
         fprintf(yyout,"CAMI(%u",*x);
        for( i = 1; i < 8; i++)
        {
        switch(ptr[i].lc)
        {
        case 1: case 2: case 6:
         fprintf(yyout,",\"%s\"",ptr[i].ptr);
          break;
         default:
            if(ptr[i].ptr[0] == '\0')
              fprintf(yyout,",0");
          else
           {
```

```
         if(strcmp(lang,"cobol") == 0)
         {
           size = c2cob(ptr[i].ptr,ptr[i].tf);
           if( size == 0)
           {
    printf("invalid argument %s in EXEC CICS at line %d\n",ptr[i].ptr,ln);
           goto end6;
           }
           if( i == 1)
           {
           if(ptr[2].lc == 6)
           sprintf(ptr[2].ptr,"%d",size);
           }
           if( i == 3)
           {
           if(ptr[4].lc == 6)
           sprintf(ptr[4].ptr,"%d",size);
           } if( (i == 1 && ptr[1].tf == 2) && flag.func != 0)
                   fprintf(yyout,",\&_SPTR");
           else
           fprintf(yyout,",%s",ptr[i].ptr);
           }
               else
                   switch(ptr[i].tf)
                   {
                     case 1: case 2:
                   if( i == 1 && flag.func != 0)
                      fprintf(yyout,",\&_SPTR");
                      else
                      fprintf(yyout,",(char *)%s",ptr[i].ptr);
                      break;
                      default:
                      fprintf(yyout,",(char *)\&%s",ptr[i].ptr);
                   }
             } /* end switch */
     }
          fprintf(yyout,");\n");
end6:   for( i = 1; i < 8; i ++) ptr[i].ptr[0] = '\0';
/* print STS statement for loop ends here */
             }
              } /* else condition ends here */
                  }
                }
[A-Za-z_][A-Za-z0-9_]*:  {
                          fprintf(yyout,"%s\n",yytext);
                          fprintf(yyout,"if(_HCOND != 0) {\n");
                          fprintf(yyout,"if(setjmp(_HS[STATUS].jbuf) == 0) {\n")
                          fprintf(yyout,"_HCOND = 0; \n");
                          fprintf(yyout,"longjmp(jbuf,0);\n");
                          fprintf(yyout,") } \n");
                        }
\&[A-Za-z_][A-Za-z0-9_\[\]\-]* { if ( state == 0)
                     fprintf(yyout,"%s",yytext);
              else
                {
                 if(state != 4)
                 {
                 printf("ERROR in EXEC CICS command at line %d\n",ln);
                 state = 0;
                 }
                 else
                  {
                   state = 5;
                     strcpy(ptr[pf].ptr,yytext);
                  }
                }
              }
[A-Za-z_][A-Za-z0-9_\[\]\-]* { if ( state == 0)
                     fprintf(yyout,"%s",yytext);
              else
                {
                 if(state != 4)
                 {
```

```
                        printf("ERROR in EXEC CICS command at line %d\n",ln);
                        state = 0;
                        )
                        else
                            {
state4:
                                state = 5;
                                if(flag.cmd == 6)
                                {
                                    if(strcmp(lang,"cobol") == 0)
                                    {
                                        if(glabel(string,yytext) == -1)
                                        {
                        printf("ERROR IN EXEC CICS COMMAND at line %d\n",ln);
                        printf("invalid paragraph or section name - %s\n",;
                                            state = 0;
                                            goto end4;
                                        }
                                    }
                                    else
                                    strcpy(string,yytext);
                                    switch(flag.func)
                                    {
                                    case 1:
                                    case 2:
                                fprintf(yyout," goto %s;\n",string);
                                    break;
                                    case 3:
                                    break;
                                    default: ;
                                    }
                                }
                                else
                                strcpy(ptr[pf].ptr,yytext);
end4: ;
                            }
                        }
                    }
'[A-Za-z0-9_\-]*' { if ( state == 0)
        /* literals name */
                    fprintf(yyout,"%s",yytext);
                else
                    {
                     if(state != 4)
                    {
                    printf("ERROR in EXEC CICS command at line %d\n",ln);
                    state = 0;
                    }
                    else
                        {
                            state = 5;
                            if(ptr[pf].tf == 1 )
                            {
                                strcpy(string,yytext);
                                    string(yyleng - 1] = '\0';
                                    strcpy(ptr[pf].ptr, string+1);
                                    ptr[pf].lc = 1;
                            }
                            else
                            {
                            printf("ERROR in EXEC CICS command at line %d\n",ln
                            printf("invalid use of literal\n");
                            state = 0;
                            }
                        }
                    }
                }
[0-9]+ { if ( state == 0)
                fprintf(yyout,"%s",yytext);
            else
                {
                 if(state != 4)
                {
                printf("ERROR in EXEC CICS command at line %d\n",ln);
                state = 0;
                }
```

```
            else
            {
              state = 5;
                if(ptr[pf].tf == 4)
                {
                strcpy(ptr[pf].ptr,yytext);
                ptr[pf].lc = 2;
                }
                else
                {
              printf("ERROR in EXEC CICS command at line %d\n",ln);
              printf("invalid use of constant\n");
                state = 0;
                }

}
          }
        }
")"     { if ( state == 0)
                fprintf(yyout,"%s",yytext);
            else
            {
              if(state != 5)
              {
              printf("ERROR in EXEC CICS command at line %d\n",ln);
              state = 0;
              }
              else
              {
                state = 2;
                if(jstate == 1) goto state6;
              }
            }
        }

/* TEST PROGRAM   */ include "STSMAP1.h"
include "demotest.h"
#include "STATUS.h"
#include "handle.h"
#include "STS.h"
#include "CA.h"
main(argc,argv)
int argc;
char *argv[];
{
struct MENU1 *mm;
struct recl buf;
unsigned short length;
char *twaarea;
char dkey[10];
char yyy[10];
char dname[10];
char fdata[91];
char xxxx[50];
unsigned short dlength;
unsigned short plength;
unsigned short klength;
unsigned short jname;
int  yy;
char *data;
char *label;
data=(char *) &(buf);
strcpy(xxxx,"Demotest program Entry Point\n");
label=(char *)(xxxx);
EXEC CICS INIT CAARG(argv) CAMIB(CAMIB) CACOMMAREA(COMMAREA) END-EXEC
EXEC CICS ASSIGN TWALENG(length) END-EXEC
if(length > 0)
{
EXEC CICS ADDRESS TWA(twaarea) END-EXEC
}
EXEC CICS WRITEQ TD QUEUE('INQ1') FROM(label) LENGTH(40) END-EXEC
again:
```

```
EXEC CICS HANDLE CONDITION MAPFAIL (SMAP)
                            DUPREC(DUPRECORD)
                            ERROR(err_rtn)
END-EXEC
EXEC CICS IGNORE CONDITION NOTFND END-EXEC
EXEC CICS RECEIVE MAP('MENU1') MAPSET('STSMAP1') SET(aa) END-EXEC
for(yy=0;yy<9;yy++)
    dname[yy]='\0';
strncpy(dname,aa->FIELD1,8);
for(yy=0;yy<9;yy++)
    dkey[yy]=' ';
dkey[9]='\0';
strncpy(dkey,aa->FIELD2,aa->FIELD2L);
switch(aa->FIELD4[0])
{
case '1':
EXEC CICS LINK PROGRAM('demotran') END-EXEC
EXEC CICS SEND MAP('MENU1') MAPSET('STSMAP1') MAPONLY CURSOR ERASE END-EXEC
goto again;
case 's':
klength=10;
dlength=60;
EXEC CICS STARTBR KEYLENGTH(klength) RIDFLD(dkey) DATASET(dname)
END-EXEC
EXEC CICS READNEXT INTO(data) DATASET(dname)
LENGTH(dlength) END-EXEC
strncpy(aa->FIELD2,buf.keyfield,9);
strncpy(aa->FIELD3,buf.field2,50);
EXEC CICS SEND MAP('MENU1') MAPSET('STSMAP1') CURSOR FROM(aa) END-EXEC
break;
case 'r':
klength=10;
dlength=60;
EXEC CICS READ INTO(data) KEYLENGTH(klength) RIDFLD(dkey) DATASET(dname)
LENGTH(dlength) END-EXEC
if(STATUS>0)
{
EXEC CICS SEND MAP('MENU1') MAPSET('STSMAP1') MAPONLY CURSOR ERASE END-EXEC
goto again;
}
strncpy(aa->FIELD2,buf.keyfield,9);
strncpy(aa->FIELD3,buf.field2,50);
aa->FIELD4[0]=' ';
strncpy(aa->FIELD1,"        ",8);
EXEC CICS SEND MAP('MENU1') MAPSET('STSMAP1') CURSOR FROM(aa) END-EXEC
break;
case 'd':
klength=10;
dlength=60;
EXEC CICS READ INTO(data) KEYLENGTH(klength) RIDFLD(dkey) DATASET(dname)
LENGTH(dlength) UPDATE END-EXEC
if(STATUS>0)
{
EXEC CICS SEND MAP('MENU1') MAPSET('STSMAP1') MAPONLY CURSOR ERASE END-EXEC
goto again;
}
strncpy(aa->FIELD2,buf.keyfield,9);
strncpy(aa->FIELD3,buf.field2,50);
aa->FIELD4[0]=' ';
aa->FIELD4L=-1;
EXEC CICS SEND MAP('MENU1') MAPSET('STSMAP1') CURSOR FROM(aa) END-EXEC
EXEC CICS RECEIVE MAP('MENU1') MAPSET('STSMAP1') SET(aa) END-EXEC
if(aa->FIELD4[0]=='d')
EXEC CICS DELETE DATASET(dname) END-EXEC
else
EXEC CICS UNLOCK DATASET(dname) END-EXEC
EXEC CICS SEND MAP('MENU1') MAPSET('STSMAP1') MAPONLY CURSOR ERASE END-EXEC
goto again;
case 'u':
klength=10;
dlength=60;
EXEC CICS READ INTO(data) KEYLENGTH(klength) RIDFLD(dkey) DATASET(dname)

LENGTH(dlength) UPDATE END-EXEC
if(STATUS>0)
{
```

```
EXEC CICS SEND MAP('MENU1') MAPSET('STSMAP1') MAPONLY CURSOR ERASE END-EXEC
goto again;
}
strncpy(aa->FIELD2,buf.keyfield,9);
strncpy(aa->FIELD3,buf.field2,50);
EXEC CICS SEND MAP('MENU1') MAPSET('STSMAP1') CURSOR FROM(aa) END-EXEC
EXEC CICS RECEIVE MAP('MENU1') MAPSET('STSMAP1') SET(aa) END-EXEC
if(aa->FIELD3L>0 || aa->FIELD4[0]!='e')
{
strncpy(buf.field2,aa->FIELD3,49);
buf.field2[49]='\0';
EXEC CICS REWRITE DATASET(dname) FROM(data) LENGTH(dlength) END-EXEC
}
else
{
EXEC CICS UNLOCK DATASET(dname) END-EXEC
EXEC CICS SEND MAP('MENU1') MAPSET('STSMAP1') MAPONLY CURSOR ERASE END-EXEC
}
break;
case 'a':
dlength=60;
strncpy(buf.keyfield,dkey,9);
buf.keyfield[9]='\0';
strncpy(buf.field2,aa->FIELD3,49);
buf.field2[49]='\0';
EXEC CICS WRITE FROM(data) RIDFLD(dkey) DATASET(dname) LENGTH(dlength)
END-EXEC
EXEC CICS SEND MAP('MENU1') MAPSET('STSMAP1') MAPONLY CURSOR ERASE END-EXEC
break;
case 'e':
EXEC CICS RETURN
END-EXEC
}
goto again;
SNAP:
EXEC CICS SEND MAP('MENU1') MAPSET('STSMAP1') MAPONLY CURSOR ERASE END-EXEC
EXEC CICS RETURN TRANSID('test') END-EXEC
DUPRECORD:
printf("THIS IS DUP-KEY  HANDLE\n");
goto again;
err_rtn:
goto again;
}

/* TEST PROGRAM FOLLOWING PREPROCESSOR */ include "STSMAP1.h"
include "demotest.h"
#include "STATUS.h"
#include "handle.h"
#include "STS.h"
#include "CA.h"
main(argc,argv)
int argc;
char *argv[];
{
struct MENU1 *aa;
struct rec1 buf;
unsigned short length;
char *twaarea;
char dkey[10];
char yyy[10];
char dname[10];
char fdata[91];
char xxxx[50];
unsigned short dlength;
unsigned short plength;
unsigned short klength;
unsigned short jname;
int yy;
char *data;
char *label;
data=(char *) &(buf);
strcpy(xxxx,"Demotest program Entry Point\n");
label=(char *)(xxxx);
```

```
VMI(0,(char *)argv,0,0,0,0,0,0);
VMI(335544320,(char *)&CAMIB,0,0,0,0,0,0);
VMI(352321536,(char *)&COMMAREA,0,0,0,0,0,0);

VMI(100663296,0,(char *)&length,0,0,0,0,0);

if(length > 0)
{
_SPTR = (char *)twaarea;
VMI(67108864,&_SPTR,0,0,0,0,0,0);

}
    _SPTR = (char *)label;
VMI(1864634368,&_SPTR,"40",0,0,"INQ1",0,0);

again:
if(_HCOND != 0) {
if(setjmp(_HS[STATUS].jbuf) == 0) {
_HCOND = 0;
longjmp(jbuf,0);
} }

_HS[65].hc = 1;
STATUS = 65;
_HCOND = 1;
if(setjmp(jbuf) == 0)
   goto SMAP;
                                _HS[33].hc = 1;
STATUS = 33;
_HCOND = 1;
if(setjmp(jbuf) == 0)
 goto DUPRECORD;
                                _HS[87].hc = 1;
STATUS = 87;
_HCOND = 1;
if(setjmp(jbuf) == 0)
 goto err_rtn;

_HS[32].hc = 3;
     VMI(1275336968,(char *)&aa,0,"MENU1",0,"STSMAP1",0,0);

for(yy=0;yy<9;yy++)
   dname[yy]='\0';
strncpy(dname,aa->FIELD1,8);
for(yy=0;yy<9;yy++)
   dkey[yy]=' ';
dkey[9]='\0';
strncpy(dkey,aa->FIELD2,aa->FIELD2L);
switch(aa->FIELD4[0])
{
case '1':
   VMI(570687488,0,0,"demotran",0,0,0,0);

VMI(1107630096,0,0,"MENU1",0,"STSMAP1",0,0);

goto again;
case 's':
klength=10;
dlength=60;
    VMI(1744830464,0,0,(char *)dkey,(char *)&klength,(char *)dname,0,0);

_SPTR = (char *)data;
VMI(1677721600,&_SPTR,(char *)&dlength,0,0,(char *)dname,0,0);

strncpy(aa->FIELD2,buf.keyfield,9);
strncpy(aa->FIELD3,buf.field2,50);
     _SPTR = (char *)aa;
VMI(1107564816,&_SPTR,0,"MENU1",0,"STSMAP1",0,0);

break;
case 'r':
klength=10;
dlength=60;
    _SPTR = (char *)data;
VMI(1660944384,&_SPTR,(char *)&dlength,(char *)dkey,(char *)&klength,(char *)dname,
```

```
if(STATUS>0)
{
        VMI(1107630096,0,0,"MENU1",0,"STSMAP1",0,0);
goto again;
}
strncpy(aa->FIELD2,buf.keyfield,9);
strncpy(aa->FIELD3,buf.field2,50);
aa->FIELD4[0]=' ';
strncpy(aa->FIELD1,"        ",8);
        _SPTR = (char *)aa;
VMI(1107564816,&_SPTR,0,"MENU1",0,"STSMAP1",0,0);

break;
case 'd':
klength=10;
dlength=60;
        _SPTR = (char *)data;
VMI(1660952576,&_SPTR,(char *)&dlength,(char *)dkey,(char *)&klength,(char *)dname, if(STATUS>0)
{
        VMI(1107630096,0,0,"MENU1",0,"STSMAP1",0,0);

goto again;
}
strncpy(aa->FIELD2,buf.keyfield,9);
strncpy(aa->FIELD3,buf.field2,50);
aa->FIELD4[0]=' ';
aa->FIELD4L=-1;
        _SPTR = (char *)aa;
VMI(1107564816,&_SPTR,0,"MENU1",0,"STSMAP1",0,0);

VMI(1275336968,(char *)&aa,0,"MENU1",0,"STSMAP1",0,0);

if(aa->FIELD4[0]=='d')
   VMI(1761607680,0,0,0,0,(char *)dname,0,0);

else
   VMI(1644167168,0,0,0,0,(char *)dname,0,0);

VMI(1107630096,0,0,"MENU1",0,"STSMAP1",0,0);

goto again;
case 'u':
klength=10;
dlength=60;
        _SPTR = (char *)data;
VMI(1660952576,&_SPTR,(char *)&dlength,(char *)dkey,(char *)&klength,(char *)dname, if(STATUS>0)
{
        VMI(1107630096,0,0,"MENU1",0,"STSMAP1",0,0);

goto again;
}
strncpy(aa->FIELD2,buf.keyfield,9);
strncpy(aa->FIELD3,buf.field2,50);
        _SPTR = (char *)aa;

VMI(1107564816,&_SPTR,0,"MENU1",0,"STSMAP1",0,0);

VMI(1275336968,(char *)&aa,0,"MENU1",0,"STSMAP1",0,0);

if(aa->FIELD3L>0 || aa->FIELD4[0]!='e')
{
strncpy(buf.field2,aa->FIELD3,49);
buf.field2[49]='\0';
        _SPTR = (char *)data;
VMI(1895825408,&_SPTR,(char *)&dlength,0,0,(char *)dname,0,0);

}
else
{
    VMI(1644167168,0,0,0,0,(char *)dname,0,0);
```

```
        VMI(1107630096,0,0,"MENU1",0,"STSMAP1",0,0);
    }
    break;
    case 'a':
    dlength=60;
    strncpy(buf.keyfield,dkey,9);
    buf.keyfield[9]='\0';
    strncpy(buf.field2,aa->FIELD3,49);
    buf.field2[49]='\0';
          _SPTR = (char *)data;
    VMI(1079048192,&_SPTR,(char *)&dlength,(char *)dkey,0,(char *)dname,0,0);

VMI(1107630096,0,0,"MENU1",0,"STSMAP1",0,0);

break;
    case 'e':
       VMI(553648128,0,0,0,0,0,0,0);

}
    goto again;
SMAP:
if(_HCOND != 0) {
if(setjmp(_HS[STATUS].jbuf) == 0) {
_HCOND = 0;
longjmp(jbuf,0);
} }

VMI(1107630096,0,0,"MENU1",0,"STSMAP1",0,0);

VMI(553910272,0,0,"test",0,0,0,0);

DUPRECORD:
if(_HCOND != 0) {
if(setjmp(_HS[STATUS].jbuf) == 0) {
_HCOND = 0;
longjmp(jbuf,0);
} } printf("THIS IS DUP-KEY  HANDLE\n");
goto again;
err_rtn:
if(_HCOND != 0) {
if(setjmp(_HS[STATUS].jbuf) == 0) {
_HCOND = 0;
longjmp(jbuf,0);
} } goto again;
}

/* VIRTUAL MANAGEMENT INTERFACE */ include "global.h"
int STATUS;
VMI(x,a1,a2,a3,a4,a5,a6,a7)
unsigned int x;
char **a1;
char *a2;
char *a3;
char *a4;
char *a5;
char *a6;
char *a7;
{
char string[20];
struct SFD flag;
unsigned int *pp;
pp = (unsigned int *)&flag;
*pp = x;
switch(flag.class)
{
case 0:
SMI(x,a1,a2,a3,a4,a5,a6,a7);
break;
case 1:
```

```
    TMI(x,s1,s2,s3,s4,s5,s6,s7);
    break;
    case 2:
    PMI(x,s1,s2,s3,s4,s5,s6,s7);
    break;
    case 3:
    DAMI(x,s1,s2,s3,s4,s5,s6,s7);
    break;
    case 4:
    JMI(x,s1,s2,s3,s4,s5,s6,s7);
    break;
    case 5:
    ITCMI(x,s1,s2,s3,s4,s5,s6,s7);
    break;
    default: ;
    }
    return(STATUS);
    }

/* JOURNAL MANAGEMENT INTERFACE MODULE */
    #include         "global.h"
    #include "CMHD.h"
    JMI(x,buff,length,REQID,JFILEID,JTYPID,PREFIX,PFXLENG)
    char *length;
    char *JFILEID;
    char **buff;
    char *REQID;
    char *JTYPID;
    char *PREFIX;
    char *PFXLENG;
    unsigned int x;
    {
    char string[32];
    struct CMHD cmd;
    register int i;
    int slength;
    short found;
    unsigned short size;
    int err;
    struct JMSGD *MSG;
    char tstr[40];
    struct SFD flag;
    char path[60];
    char msysid[4];
    unsigned short plength;
    unsigned int *p;
    p = (unsigned int *)&flag;
    *p = x;
    MSG = (struct JMSGD *)TCA->MSG;
    memset((char *)MSG,'\0',sizeof(struct JMSGD));
    *(int *)MSG->IHD.dtid = TCA->tid;
    TCA->MSG->IHD.tid = TCA->myid;
    MSG->dbmask = TCA->MASK;
    strncpy(msysid,TCA->SYSID,4);
    strncpy(MSG->IHD.osysid,msysid,4);
    strncpy(MSG->IHD.dsysid,msysid,4);
    MSG->IHD.dtiid = 'j';
    MSG->IHD.dfiid = 'j';
    MSG->IHD.oiid = 'j';
    cmd.req_typ = ' ';
    switch(flag.func)
    {
    case 1: case 2:
    plength = 0;
    if(PFXLENG != NULL)
    {
    if(x & LC7)
    plength = atoi(PFXLENG);
    else
     memcpy((char *)&plength,PFXLENG,2);
    memcpy(MSG->data,PREFIX,plength);
    }
    size = 0;
    if(buff != NULL)
    {
```

```
if(x & LC2)
size = atoi(length);
else    {
        if(length != NULL)
        memcpy((char *)&size,length,2);
        }
if(size > 0)
{
MSG->length = size;
memcpy(&(MSG->data[plength]),*buff,size);
}
}
*(unsigned int *)&MSG->sid = x;
if(JFILEID != NULL)
{
if(x & LC4)
MSG->JFILEID = atoi(JFILEID);
else
memcpy(MSG->JFILEID,JFILEID,2);
}
if(JTYPID != NULL)
{
MSG->JTYPID[0] = JTYPID[0];
MSG->JTYPID[1] = JTYPID[1];
}
slength = 36 + 8 + size + plength + 12;
cad.req_typ = ' ';
SEND((char *)MSG,slength,&cad,msysid);
MSG->sid.mask = 0;
rcv2:
cad.req_typ = 't';
err =RECEIVE((char *)MSG,20000,&cad,msysid,'j');
if(TCA->mysid != TCA->MSG->IHD.tid) goto rcv2;
/* if REQID was provided then move to REQID */
TCA->status = MSG->sid.mask;
break;
default: TCA->status = INVREQ;
}
}

/* JOURNAL PROCESS */
#define  CBIDERR    19
#define  DISABLED   29
#define  DSIDERR    25
#define  DSSTAT     83
#define  DUPKEY     35
#define  DUPREC     33
#define  ENDDATA    53
#define  ENDFILE    30
#define  ENDINPT    4
#define  ENQBUSY    61
#define  ENVDEFERR  60
#define  EOC        21
#define  EODS       2
#define  EOF        3
#define  ERROR      87
#define  EXPIRED    57
#define  FUNCERR    84
#define  IGREQCD    18
#define  ILLOGIC    26
#define  INBFMH     22
#define  INCINVREQ  37
#define  INVERRTERM 67
#define  INVLDC     75
#define  INVMPSZ    66
#define  INVPARTN   73
#define  INVPARTNSET 74
#define  INVREQ     10
#define  INVTSREQ   56
#define  IOERR      31
#define  ISCINVREQ  47
#define  LENGERR    11
#define  MAPFAIL    65
#define  NONVAL     24
#define  NOPASSBKRD 16
#define  NOPASSBKWR 17
```

```
#define  NOSPACE     34
#define  NOSTART     23
#define  NOSTB       50
#define  NOTALLOC    9
#define  NOTAUTH     38
#define  NOTFND      32
#define  NOTOPEN     28
#define  OVERFLOW    79
#define  PARTNFAIL   72
#define  PGMIDERR    51
#define  QBUSY       45
#define  QIDERR      41
#define  QZERO       40
#define  RDATT       71
#define  RETPAGE     63
#define  ROLLEDBACK  62
#define  RTEFAIL     69
#define  RTESOME     68
#define  SELNERR     85
#define  SESSBUSY    8
#define  SESSIONERR  6
#define  SIGNAL      14
#define  SYSBUSY     7
#define  SYSIDERR    5
#define  TERMERR     20
#define  TERMIDERR   15
#define  TRANSIDERR  54
#define  TSIOERR     78
#define  UNEXPIN     76
#define  WRBRK       12
#define  JIDERR      101
#define  ITEMERR     100
#define  GENERIC     020000000
#define  RBA         002000000
#define  RRN         000200000
#define  UPDATE      000020000
#define  GTEQ        000002000
#define  MASSINSERT  000000200
#define  EQUAL       000000020
#define  DEFKEY      000000002
#define  DEBREC      040000000
#define  NUMERIC     004000000
#define  STARTIO     000400000
#define  NOSUSPEND   000040000
#define  NEXT        000004000
#define  MAIN        000000400
#define  LIT9        000000040
#define  LIT6        000000004
#define  WAIT        200000000
struct JMSGD
{
long atype;
char dsysid[4];
char dssys[4];
int  dtid;
char dtiid;
char dfiid;
char osysid[4];
char otid[4];
char otrid[4];
char otiid;
char ofiid;
char reqtype;    /* a - appc b - database s-system c -com */
char oiid;       /* orig. interface queue id */
short length;
unsigned int cmd:3;
unsigned int func:5;
unsigned int mask:24; /* return status code in dbmask field */
int rmask;       /* encypted format to be implemented */
char jreq[4];    /* REQID[4] unique id assigned by STS by JMIQ */
unsigned short jf; /* JFILEID                */
char     jtyp[2]; /* JTYPID[2] two bytes character data */
unsigned short pfxl; /* PFXLENG1              */
unsigned short jlength;  /* length of from field users data */
char data[20000]; /* data[0] - PREFIX if provided
                    data[PFXLENG] - users data */
```

```c
};
struct CMHD
        {
        unsigned  int timeout:16;
        unsigned int cmd:8;
        unsigned int req_typ:8;
        };
struct journal
{
unsigned int jrid:7;     /* Max. 100 journal files      */
unsigned int jrst:1;     /* Disabled =0  Enabled =1    */
unsigned int bufsize:15; /* flush when size in buffer   */
unsigned int status:1;   /* 0 = disabled  1 = enabled  */
unsigned int i_o:1;      /* 0 = input  1 = input-output */
unsigned int crit:1;     /* 0 = not critical 1 - critical */
unsigned int pause:1;    /* 0 = no pause   1 = pause    */
unsigned int retry:1;    /* 0 = no retry   1 = retry    */
unsigned int fill:4;     /* Reserved for future use     */
unsigned int sec;        /* security mask               */
char         jrname[32]; /* path name of log            */
};
struct jnl
{
unsigned int jrid:7;     /* Max. 100 journal files      */
unsigned int jrst:1;     /* Disabled =0  Enabled =1    */
unsigned int bufsize:15; /* flush when size in buffer   */
unsigned int status:1;   /* 0 = disabled  1 = enabled  */
unsigned int i_o:1;      /* 0 = input  1 = input-output */
unsigned int crit:1;     /* 0 = not critical 1 - critical */
unsigned int pause:1;    /* 0 = no pause   1 = pause    */
unsigned int retry:1;    /* 0 = no retry   1 = retry    */
unsigned int fill:4;     /* Reserved for future use     */
unsigned int bl:15;      /* counter of data in buffer   */
unsigned int sec;        /* security mask               */
int          fprt;
char         *buf;
};
#define OK 0
struct jnl j[100];
int j_on;
main(argc,argv)
int argc;
char *argv[];
{
        int yy;
        int rsize;
        int l;
        struct JMSGD    *r;
        struct CMHD     *cd;
        struct journal  *jr;
        int ap;
        int jrtbl;
        int total;
        int sflag;
        int wflag;
        close(2);

close(0);
        printf("STS-JRC0003 - JOURNAL INTERFACE STARTED\n");
if((jrtbl=open("JRN.STS",0))<0)
{
        printf("STS-JRC0001 - CAN NOT OPEN STS JOURNAL TABLE -  JRN.STS\n");
        printf("STS-JRC0002 - NO JOURNALS OR LOGGING ACTIVE\n");
        j_on=0;
}
else
{
        j_on=1;
        jr= (struct journal *) calloc(1,sizeof (struct journal));
        rsize=sizeof(struct journal);
        while((rsize=read(jrtbl,(char *) jr,rsize))== sizeof(struct journa
        {
                if(jr->status==1)
                {
```

```
                                ap=jr->jrid;
                                j[ap].status=1;
                                j[ap].bufsize=jr->bufsize;
                                j[ap].sec=jr->sec;
                                j[ap].crit=jr->crit;
                                j[ap].i_o=jr->i_o;
                                j[ap].pause=jr->pause;
                                j[ap].retry=jr->retry;
                                j[ap].buf = (char *) calloc(1,2000);
                                if(total<18)
                                {
                                        if((j[ap].fprt=open(jr->jrname,1))<0)
                                        {
                                                if(j[ap].crit==1)
                                                {
                                                        printf("Required Journal r
                                                        exit();
                                                }
                                                j[ap].status=0;
                                        }
                                        else
                                        {
                                                total++;
                                                j[ap].status=1;
                                        }
                                }
                        }
                }
                close(jrtbl);
                free(jr);
        }
        r=(struct JMSGD *) calloc(1,sizeof(struct JMSGD));
        cd=(struct CMHD *) calloc(1,sizeof(struct CMHD));
        for(;;)
        {
again:
                cd->req_typ = ' ';
                if((l=RECEIVE((char *)r,20000,cd,argv[1],argv[2][0]))==-1)
                {
                        r->mask=INVREQ;
                        SEND((char *)r,1,cd,argv[1]);
                        goto again;
                }
                if(r->dfiid=='d')
                        cd->req_typ = 'd';
                else
                        cd->req_typ = 't';
                if(j_on==0 )
                {
                    if(cd->req_typ != 'd')
                    {
                        r->mask=OK;
                        SEND((char *)r,1,cd,argv[1]);
                        goto again;
                    }
                    goto again;
                }
                if(cd->req_typ != 'd' && jrsecr(r->rmask)!=OK)
                {
                        r->mask=NOTAUTH;
                        SEND((char *)r,1,cd,argv[1]);
                        goto again;
                }
                if(j[r->jf].status== 0)
                {
                    if(cd->req_typ != 'd')
                    {
                        r->mask=JIDERR;
                        SEND((char *)r,1,cd,argv[1]);
                        goto again;
                    }
                    goto again;
                }
                switch(r->func)
                {
                case 1:
```

```
                if(j[r->jf].bl + 10 + r->jlength > 20000)
                {
                        write(j[r->jf].fprt,j[r->jf].buf,j[r->jf].bl);
                        j[r->jf].bl=0;
                }
                memcpy(&(j[r->jf].buf[j[r->jf].bl]),"ZZZZ",4);
                j[r->jf].bl = j[r->jf].bl +4;
                memcpy(&(j[r->jf].buf[j[r->jf].bl]),(char *) &(r->dtid),4);
                j[r->jf].bl = j[r->jf].bl +4;
        if(r->jreq[0]!='\0')
                memcpy(&(j[r->jf].buf[j[r->jf].bl]),r->jreq,4);
                j[r->jf].bl = j[r->jf].bl +4;

if(r->jtyp[0]!='\0')
                memcpy(&(j[r->jf].buf[j[r->jf].bl]),r->jtyp,2);
                j[r->jf].bl = j[r->jf].bl +2;

memcpy(&(j[r->jf].buf[j[r->jf].bl]),"+",1);
                j[r->jf].bl++;

if(r->data[0]!='\0')
                memcpy(&(j[r->jf].buf[j[r->jf].bl]),r->data,r->jlength);
                j[r->jf].bl = j[r->jf].bl + r->jlength;

if(r->mask & STARTIO == STARTIO)
                {
                        sflag=1;
                        if(r->mask & WAIT == WAIT)
                                wflag=1;
                        else
                                wflag=0;
                        break;
                }
                if(r->mask & WAIT == WAIT)
                        wflag=1;
                else
                        wflag=0;
                break;
        case 2:
                if(j[r->jf].bl>0)
                        write(j[r->jf].fprt,j[r->jf].buf,j[r->jf].bl);
                j[r->jf].bl=0;
                break;
        default:
                r->mask=INVREQ;
                SEND((char *)r,1,cd,argv[1]);
        }
        if(cd->req_typ!='d')
        {
                if(wflag == 1)
                {
                        write(j[r->jf].fprt,j[r->jf].buf,j[r->jf].bl);
                        r->mask=OK;
                        l=48;
                        SEND((char *)r,1,cd,argv[1]);
                        j[r->jf].bl=0;
                        wflag=0;
                        sflag=0;
                        goto again;
                }
                if(sflag==1)
                {
                        r->mask=OK;
                        l=48;
                        SEND((char *)r,1,cd,argv[1]);
                        write(j[r->jf].fprt,j[r->jf].buf,j[r->jf].bl);
                        j[r->jf].bl=0;
                        sflag=0;
                        goto again;
                }
                r->mask=OK;
                l=48;
                SEND((char *)r,1,cd,argv[1]);
```

```
            }
        uflag=0;
        sflag=0;
            if(j[r->jf].bl > j[r->jf].bufsize);
            write(j[r->jf].fprt,j[r->jf].buf,j[r->jf].bl);
            j[r->jf].bl=0;
        }
}

/* BLACKBOARD GENERATION AND INTERFACE PROCESS ATTACHMENT */ include <stdio.h>
include <signal.h>
#include "START.h"
#include "global.h"
#include         <sys/types.h>
#include         <sys/ipc.h>
#include         <sys/shm.h>
#include <sys/msg.h>
char *shmat();
char *nargv[6];
main(argn,argv)
char argn;
char *argv[];
{
int shmid;
int size;
char *ptr,*nptr;
key_t key;
int i,fd;
FILE *fp;
char string[40];
long offset;
int len;
unsigned short id;
short found;
umask();
signal(SIGINT,SIG_IGN);
signal(SIGHUP,SIG_IGN);
signal(SIGQUIT,SIG_IGN);
if(argn < 2)
{
printf("missing arguments\n");
printf("FORMAT IS - START 'SYSTEM' \n");
exit();
}
if(strlen(argv[1]) < 4)
{
printf("Invalid 'SYSTEM' name\n");
exit();
}
if((fp = fopen("/usr/STSCOMMON/CONFIG.STS","r+")) == NULL)
{
printf("Missing config file\n");
exit();
}
found = false;
while( fgets((char *)&config,80,fp) != NULL)
{
len = strlen(config.name);
config.del1 = '\0';
config.del2 = '\0';
config.del3 = '\0';
for(i = 0; i < 4; i++)
if(config.name[i] == ' ') config.name[i] = '\0';
if(strcmp(argv[1],config.name) == 0) { found = true; break; }
}
if(found == false)
{
printf("Invalid 'SYSTEM' name\n");
exit();
}
if(strcmp(config.rflag,"off") == 0)
{
```

```c
printf("SYSTEM %s is marked off in configuration file\n",argv[1]);
exit();
}
if(config.flag == '0')
{
size = 4096;
/* create CSA area & get the pgm table */
strcpy(string,"/usr/STSCOMMON/");
strcat(string,argv[1]);
key =ftok(string,'2');
shmid = shmget(key,size,01666);
if(shmid == -1)
{
printf(" STS unable to create CWA area \n");
exit();
}
key =ftok(string,'1');
shmid = shmget(key,size,01666);
if(shmid == -1)
{
printf(" STS unable to create CSA area \n");
}
ptr =  shmat(shmid,0,NULL);
config.name[len -1] = '\0';
strcpy(string,config.path);
chdir(string);
strcat(string,"/PLM.STS");
if((fd = open(string,0)) < 1)
{
printf("Missing PLM.STS file   \n");
exit();
}
read(fd,ptr,4096);
close(fd);
config.flag = '1';
offset = -len;
fseek(fp,offset,1);
config.del1 = ':';
config.del2 = ':';
config.del3 = ':';
for(i = 0; i < 4; i++)
if(config.name[i] == '\0') config.name[i] = ' ';
strcat(config.path,"\n");
#ifdef STSDEBUG
printf("len= %d\n",len);
#endif
i = 1;
fwrite((char *)&config,len,i,fp);
fclose(fp);
printf("STS SYSTEM %s is started\n",argv[1]);
}
else
{
printf("STS SYSTEM %s is already running\n",argv[1]);
exit();
}
nargv[0] = argv[0];
nargv[1] = argv[1];
nargv[2] = "d";
config.name[len -1] = '\0';
nargv[3] = config.path;
nargv[4] = '\0';
if(fork() == 0)
execv("dbinit",nargv);
nargv[2] = "j";
if(fork() == 0)
execv("jdinit",nargv);
nargv[2] = "q";
if(fork() == 0)
execv("tdinit",nargv);
/*
nargv[2] = "c";
if(fork() == 0)
execv("ciinit",nargv);
nargv[2] = "e";
```

```
if(fork() == 0)
execv("tsinit",nargv);
*/
}

/* ATTACHES USER AND ASSOCIATED TASK TO BLACKBOARD (WITH SECURITY) */ include <signal.h>
include "logon.h"
#include         "global.h"
#include         "START.h"
#include         <sys/types.h>
#include         <sys/ipc.h>
#include         <sys/shm.h>
#include <sys/msg.h>
char *nargv[3];
struct logon logon;
int pv;
int pcnt;
main(argn,argv)
char argn;
char *argv[];
{
int shmid;
unsigned int smask;
int shmid1;
int shmid3;
int size;
short found;
short efound;
short len;
char *ptr,*nptr;
key_t key;
int status;
int fd,i;
int fds, j;
FILE *fp;
char string[40];
char string1[256];
char path[40];
char tstr[12];
unsigned short id;
_mask();
if(argn < 1)
{
printf("missing arguments\n");
printf("FORMAT IS - STS 'SYSTEM' \n");
exit();
}
if((fp = fopen("/usr/STSCOMMON/CONFIG.STS","r")) == NULL)
{
printf("Missing config file\n");
exit();
}
if(strlen(argv[1]) < 4)
{
printf(" Invalid SYSTEM name - must be atleast four character long\n");
exit();
}
found = false;
while( fgets((char *)&config,80,fp) != NULL)
{
len = strlen(config.name);
config.del1 = '\0';
config.del2 = '\0';
config.del3 = '\0';
for(i=0; i < 4;i++)
if(config.name[i] == ' ')config.name[i] = '\0';
if(strcmp(argv[1],config.name) == 0) { found = true; break; }
}
if(found == false)
{
printf("Invalid 'SYSTEM' name\n");
exit();
}
```

```c
fclose(fp);
if(strcmp(config.rflag,"off") == 0)
{
printf("SYSTEM %s is marked off in configuration file\n",argv[1]);
exit();
}
if(config.flag == '0')
{
printf("SYSTEM %s is not running\n",argv[1]);
}
if((fd = open("/usr/STSCOMMON/LOGON.STS",0)) < 1)
{
printf("Missing STS logon file\n");
exit();
}
for( pcnt = 0; pcnt < 5; pcnt++)
{
printf("STS logon:");
scanf("%s",string);
found = false;
if(strcmp(string,"exit") == 0)
{
printf("goodbye\n");
exit(0);
}
lseek(fd,0L,0);
while((pv = read(fd,(char *)&logon,sizeof(struct logon))) != 0)
{
pv = false;
if(strcmp(string,logon.name) == 0)
{
pv = true;
system("stty -echo");
printf("STS Password:");
scanf("%s",string);
system("stty echo");
if(strcmp(string,logon.passwd) == 0)
        {
        found = true;
        break;
        }
else
printf("\nInvalid Password\n");
 }
}
if(found == true) break;
if(pv == false)
printf("\nInvalid logon \n");
}
if(found == false)
{
printf(" Sorry\n");
exit();
}
close(fd);
printf("\n");
signal(SIGCLD,SIG_IGN);
size = 4096;
/* create CSA area & get the pgm table */
strcpy(string,"/usr/STSCOMMON/");
strcat(string,argv[1]);
key =ftok(string,'1');
/* get CSA area */
shmid = shmget(key,size,01666);
if(shmid == -1)
{
printf(" STS unable to access CSA area \n");
exit();
}
key =ftok(string,'2');
shmid1 = shmget(key,size,01666);
if(shmid1 == -1)
{
printf(" STS unable to create CWA area \n");
exit();
}
```

```
strcpy(string,ttyname(0));
strcpy(path,string);
nargv[0] = path;
nargv[1] = '\0';
key =ftok(string,'1');
shmid3 = shmget(key,MAXMEM,01666);
if(shmid3 == -1)
{
printf(" STS unable to access TCA area \n");
exit(0);
}
TCA  = (struct TCAD *)shmat(shmid3,0,NULL);
pgm  = (struct pgmd *)shmat(shmid,0,NULL);
TCA->CSAID = shmid;
strncpy(TCA->SYSID,argv[1],4);
TCA->CWAID = shmid1;
TCA->level = 1;
/*
TCA->TWAID = 0;
TCA->cwaid = 0;
*/
TCA->tid = key;
TCA->MASK = logon.mask;
TCA->ie_os = logon.offset;
TCA->ie_sec = logon.ie_sec;
strcpy(TCA->DID,path);
len = strlen(config.path);
config.path[len-1] = '\0';
chdir(config.path);
fd = open("LM.STS",0);
fds = open("/usr/STSCOMMON/IESEC.STS",0);
if((i = TRMID(TCA->TRMID,path,TCA->MASK)) != 0)
{
switch(i)
{
case 1:
printf("can not open TERM DEFINITION FILE TRM.STS\n");
exit();
break;
case 2:
printf("missing terminal definition in the TRM.STS file\n");
exit();
break;
case 3:
printf("Security violation - Permission Denied\n");
exit();
break;
}
}
TCA->type = 0;
tstr[8] = '\0';
TCA->myid = 0;
string[4] = '\0';
for(;;)
{
fflush(stdin);
printf("Enter Task ID:");
memset(string1,'\0',256);
tstr[4] = '\0';
gets(string1);
memcpy(string,string1,4);
if(strlen(string1) < 4) { printf("INvalid task ID\n"); goto ender; }
if(strcmp(string,"exit") == 0) break;
found = false;
for(i = 0; i < PTSIZE; i++)
{
memcpy(tstr,pgm->pgm[i].exec_verb,4);
#ifdef STSDEBUG
printf("value of task =%s\n",tstr);
#endif
if(strcmp(tstr,string) == 0) { found = true; break; }
}
if(found == false)
{
```

```
printf("Invalid Task ID\n");
goto ender;
}
if(pgm->pgm[i].sec_mask)
{
if(TCA->ie_sec)
{
lseek(4,TCA->ie_os,0);
if(TCA->MASK & _IES)
{
efound = false;
while((j = read(4,string,4)) != 0 && memcmp(string,"----",4) != 0)
{
if(memcmp(string,tstr,4) == 0) { efound = true; break; }
}
}
else
{
efound = true;
while((j = read(4,string,4)) != 0 && memcmp(string,"----",4) != 0)
{
if(memcmp(string,tstr,4) == 0) { efound = false; break; }
}
}
if(efound == false)
  { printf("Task is not authorized  to run\n"); goto ender; }
}
if((TCA->MASK & _ES) || (pgm->pgm[i].sec_mask & _ES))
{
smask = TCA->MASK & _ES;
if((pgm->pgm[i].sec_mask & smask) != pgm->pgm[i].sec_mask)
  { printf("Task is not authorized  to run\n"); goto ender; }
}
else
  { printf("Task is not authorized  to run\n"); goto ender; }
}
TCA->tptr = 1;
memcpy(TCA->rmbuf,string1,strlen(string1));
TCA->rrcv = 1;
TCA->flag |= RRECVD;
TCA->pptr = 1;
TCA->AID = '\';
TCA->myid = TCA->myid + 1;
TCA->memlist.mnext = (STS_mp *)&(TCA->madr);
TCA->memlist.mnext->mlen = MAXMEM - sizeof(struct TCAD) - 4;
TCA->madr = (int *)TCA;
TCA->madr = TCA->madr+((MAXMEM-sizeof(struct TCAD) - 4)/4);
memcpy(tstr,pgm->pgm[i].phy_verb,8);
if(fork() == 0)
execv(tstr,nargv);
wait(&status);
ender: ;
}
if(TCA->TWAID != 0 && TCA->TWAID != -1)
shmctl(TCA->TWAID,IPC_RMID,NULL);
if(TCA->cwaid != 0 && TCA->cwaid != -1)
shmctl(TCA->cwaid,IPC_RMID,NULL);
shmctl(shmid3,IPC_RMID,NULL);
exit(0);

/* RESERVED SPOT BLACKBOARD COMMUNICATION ROUTINES */ include <sys/types.h>
include <sys/ipc.h>
#include "CMHD.h"
#include <sys/msg.h>
#define NULL 0
#define NOWAIT 01
struct msgbuf1
{
long mtype;
char mtext[65535];
};
```

```
RECEIVE(data,length,cad,sysid,iid)
char *data;
struct CMHD *cad;
int length;
char *sysid;
char iid;
{
struct msgbuf1 *msgp;
long msgtyp;
int msqid;
int rtrn;
key_t key;
int msgflg;
char *xx;
char string[40];
msgflg = 0;
msgflg |= MSG_NOERROR;
strcpy(string,"/usr/STSCOMMON/");
strncat( string,sysid,4);
key =ftok(string,iid);
msqid = msgget(key,01666);
msgp = (struct msgbuf1 *)data;
if(cad->req_typ == 't') msgtyp = *(int *) &(data[12]);
else
msgtyp = 1;
xx = (char *)msgp;
if(cad->cad & NOWAIT)
msgflg |= IPC_NOWAIT;
rtrn = msgrcv(msqid,msgp,length,msgtyp,msgflg);
return(rtrn);
}

/* RESERVED SPOT BLACKBOARD COMMUNICATION ROUTINES */ include <stdio.h>
include <sys/types.h>
include <sys/ipc.h>
#include "CMHD.h"
#include <sys/msg.h>
#define NULL 0
#define NOWAIT 01
FILE *CTRACE;
struct msgbuf1
{
long mtype;
char mtext[65535];
};
SEND(data,length,cad,sysid)
char *data;
int length;
struct CMHD *cad;
char *sysid;
{
int rtrn;
int msqid;
key_t key;
char string[40];
char msysid[10];
struct msgbuf1 *msgp;
msgp = (struct msgbuf1 *)data;
memset(msysid,'\0',10);
strncpy(msysid,&(data[4]),4);
switch(cad->req_typ)
{
case 't':
        msgp->mtype = 0;
        break;
case 'r':
        msgp->mtype = 1;
        string[0] = data[16];
        data[17] = data[16];
        data[17] = string[0];
        break;
break;
/* DBMSQ or CI */
```

```
case 'v': case 's': case 'c': case 'j':
        if(cmd->req_typ == 'c')
        strncpy(&(data[4]),sysid,4);
        msgp->mtype = 1;
        data[16] = cmd->req_typ;
        if(data[17] != 'c')
        data[17] = data[33];
        break;
default:
        data[16] = data[33];
        msgp->mtype = 1;
}
if(msgp->mtype == 0) msgp->mtype = *(int *)&(data[12]);
strcpy(string,"/usr/STSCOMMON/");
strncat(string,msysid,4);
key = ftok(string,data[16]);
msqid = msgget(key,01666);
if(cmd->cmd & NOWAIT)
return(msgsnd(msqid,msgp,length,IPC_NOWAIT));
else
return(msgsnd(msqid,msgp,length,NULL));
}

/* BLACKBOARD-TO-BLACKBOARD SWITCHING */ include        "global.h"
include "CMHD.h"
struct CID
        {
        MSG_T IHD;
        char data[20000];
        };
main(narg,argv)
int narg;
char *argv[];
{
extern int errno;
char string[32];
struct CMHD cmd;
register int i;
int slength;
short found;
int size,ksize;
struct SFD *flag;
int length;
char path[256];
char *data;
struct CID CI;
data = (char *)&CI;
for(;;)
{
cmd.req_typ = ' ';
length = RECEIVE(data,20000,&cmd,argv[1],argv[2][0]);
if(strncmp(argv[1],CI.IHD.dsysid,4) != 0)
{
memcpy(CI.IHD.osysid,CI.IHD.dsysid,4);
memcpy(CI.IHD.dsysid,argv[1],4);
memcpy(string,&(data[4]),14);
memcpy(&(data[4]),&(data[18]),14);
memcpy(&(data[18]),string,14);
memset(string,'\0',10);
memcpy(string,CI.IHD.dsysid,4);
cmd.req_typ = 'c';
CI.IHD.dfiid = 'c';
CI.IHD.reqtype = ' ';
}
else
{
        if(CI.IHD.dfiid == 'c' && CI.IHD.dtiid == 'c')
        {
        cmd.req_typ = ' ';
        }
        else
        {
```

```
            memcpy(string,&(data[4]),14);
            memcpy(&(data[4]),&(data[18]),14);
            memcpy(&(data[18]),string,14);
            memset(string,'\0',10);
            memcpy(string,CI.IHD.dsysid,4);
            cmd.req_typ = 'c';
            CI.IHD.dfiid = 'c';
            }
    }
    SEND(data,length,&cmd,string);
    }
}
```

Although the invention has been described and illustrated in detail, the same is by way of example only and should not be taken by way of limitation. The spirit and scope of the present invention are limited only to the terms of the appended claims.

We claim:

1. A virtual software machine for providing a virtual execution environment in a target computer system for an application software program having one or more execution dependencies that are incompatible with a software execution environment on the target computer system, comprising:

a plurality of independent processes;

a virtual control mechanism having a virtual management interface (VMI) for generating requests for execution to the plurality of independent processes and receiving results of such processing, wherein the requests for execution and the results are communicated via a message exchange mechanism;

pre-processing means for identifying at least one execution dependency of the application software program and in response thereto generating a pre-processed application software program that isolates the identified execution dependency from the application software program;

means connected to the pre-processing means for converting the pre-processed application software program and the virtual control mechanism into executable code for the target computer; and run-time means run by the operating system of the target computer system for executing the application software program in the target computer system despite the execution dependency that is incompatible with the target computer system software execution environment, wherein the run-time means comprises:

means for generating a request for execution when the execution dependency is encountered as the executable code is running in the target computer system;

means connected to the generating means for evaluating the request for execution to identify which of the plurality of independent processes is required to execute the request for execution;

means connected to the evaluating means for delivering the request for execution via a message to the identified independent process;

means connected to the delivering means for processing the request for execution using the identified independent process to thereby execute the request; and means for returning results of the executed request back to the virtual management interface via a message.

2. The virtual software machine as described in claim 1 wherein the application software program is written to execute in a CICS execution environment and the software execution environment on the target computer system is UNIX-based.

3. The virtual software machine as described in claim 1 wherein the plurality of independent processes include a database interface process for storing and retrieving data from a database management system.

4. The virtual software machine as described in claim 3 wherein the plurality of independent processes include a data access interface process for managing data across to and from the database management system.

5. The virtual software machine as described in claim 1 wherein the plurality of independent processes include a presentation interface process for controlling data presentation on input/output devices of the target computer system.

6. The virtual software machine as described in claim 1 wherein the plurality of independent processes include a journal interface process.

7. The virtual software machine as described in claim 1 wherein the plurality of independent processes include a task storage interface process.

* * * * *